United States Patent [19]
Bickford et al.

[11] Patent Number: 6,060,905
[45] Date of Patent: May 9, 2000

[54] VARIABLE VOLTAGE, VARIABLE IMPEDANCE CMOS OFF-CHIP DRIVER AND RECEIVER INTERFACE AND CIRCUITS

[75] Inventors: Harry Randall Bickford, Ossining; Chin-An Chang, Peekskill; Paul William Coteus, Yorktown Heights; Robert Heath Dennard, New Rochelle, all of N.Y.; Daniel Mark Dreps, Georgetown, Tex.; Gerard Vincent Kopcsay, Yorktown Heights, N.Y.

[73] Assignee: International Business Machines Corporation, Armonk, N.Y.

[21] Appl. No.: 08/598,084

[22] Filed: Feb. 7, 1996

[51] Int. Cl.⁷ .............................................. H03K 19/0175
[52] U.S. Cl. ................................ 326/81; 326/68; 326/86; 326/30
[58] Field of Search .................................. 326/81, 68, 16, 326/86, 30

[56] References Cited

U.S. PATENT DOCUMENTS

| | | |
|---|---|---|
| 4,853,560 | 8/1989 | Iwamura et al. . |
| 5,162,672 | 11/1992 | McMahan et al. . |
| 5,444,392 | 8/1995 | Sommer et al. ........................... 326/81 |
| 5,444,397 | 8/1995 | Wong et al. ............................... 326/81 |
| 5,477,172 | 12/1995 | Schnizlein ................................. 326/81 |
| 5,534,801 | 7/1996 | Wu et al. ................................... 326/81 |
| 5,543,733 | 8/1996 | Mattos et al. ............................. 326/81 |
| 5,583,454 | 12/1996 | Hawkins et al. .......................... 326/81 |
| 5,612,637 | 3/1997 | Shay et al. ................................ 326/81 |

FOREIGN PATENT DOCUMENTS

| | | |
|---|---|---|
| 0 315 473 A2 | 5/1989 | European Pat. Off. . |
| 0 410 402 A2 | 1/1991 | European Pat. Off. . |
| 0 463 316 A1 | 1/1992 | European Pat. Off. . |
| WO 93/00746 | 1/1993 | European Pat. Off. . |

OTHER PUBLICATIONS

IEEE Journal of Solid–State Circuits, vol. 23, No. 2, Apr. 1988, pp. 457–464, A Self–Terminating Low–Voltage Swing CMOS Output Driver, Thomas F. Knight, Jr. and Alexander Krymm.

*Primary Examiner*—Michael Tokar
*Assistant Examiner*—Richard Roseen
*Attorney, Agent, or Firm*—Daniel P. Morris

[57] ABSTRACT

An electronic apparatus is disclosed having: a plurality of electronic devices with the same or different internal voltages; an interconnection between two or more of the plurality of electronic devices; each of said two or more electronic devices has an internal voltage; driver and receiver circuits which send and receive signals at a selectable communication voltage levels for interfacing between said two or more electronic devices, at a common communication voltage which is less than the highest value of said internal voltages of said two or more electronic devices; a circuit for configuring the driver and receiver circuits; and the driver circuit are configured to have a substantially constant output impedance independent of their output voltage.

14 Claims, 27 Drawing Sheets

Variable Voltage Communication

VDD1 > VDD2 > VDD3     (Internal Voltage)

OVDD = VDD3     (External Voltage)

VM1, VM2 configure off-chip drivers and receivers
VM1, VM2 can be externally or internally controlled Chips run off variable internal voltage,
and communicate with common external voltage.

Auto Controlled Variable Driver Impedance

XM2 = Controller Driver Impedance Control Line

XM2 = 0 means high impedance mode (42 ohm)

XM2 = 1 means low impedance mode (25 ohm)

When 2nd memory card similar to memory card 205 is inserted into slot 2, XM2 changes state.

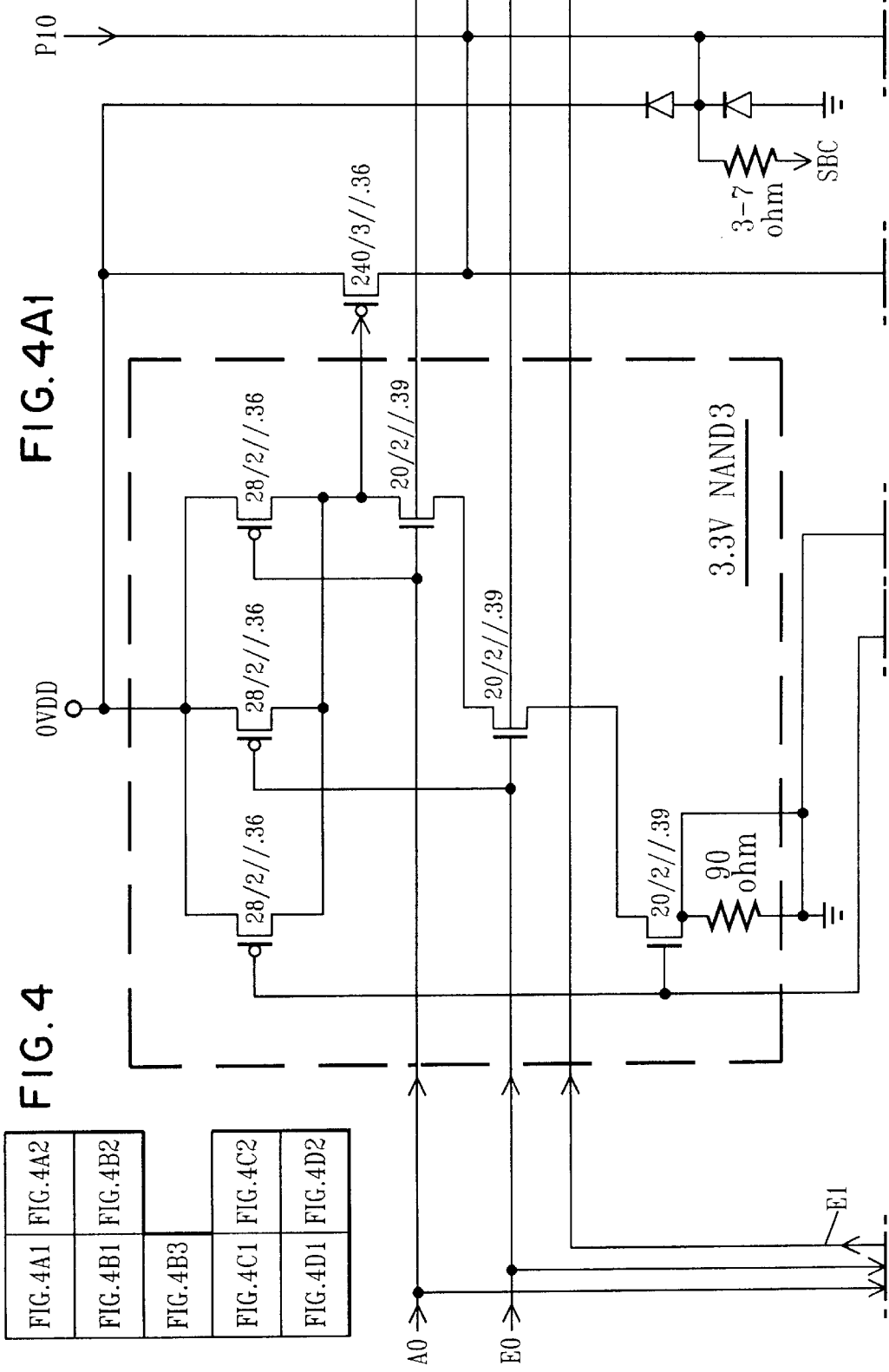

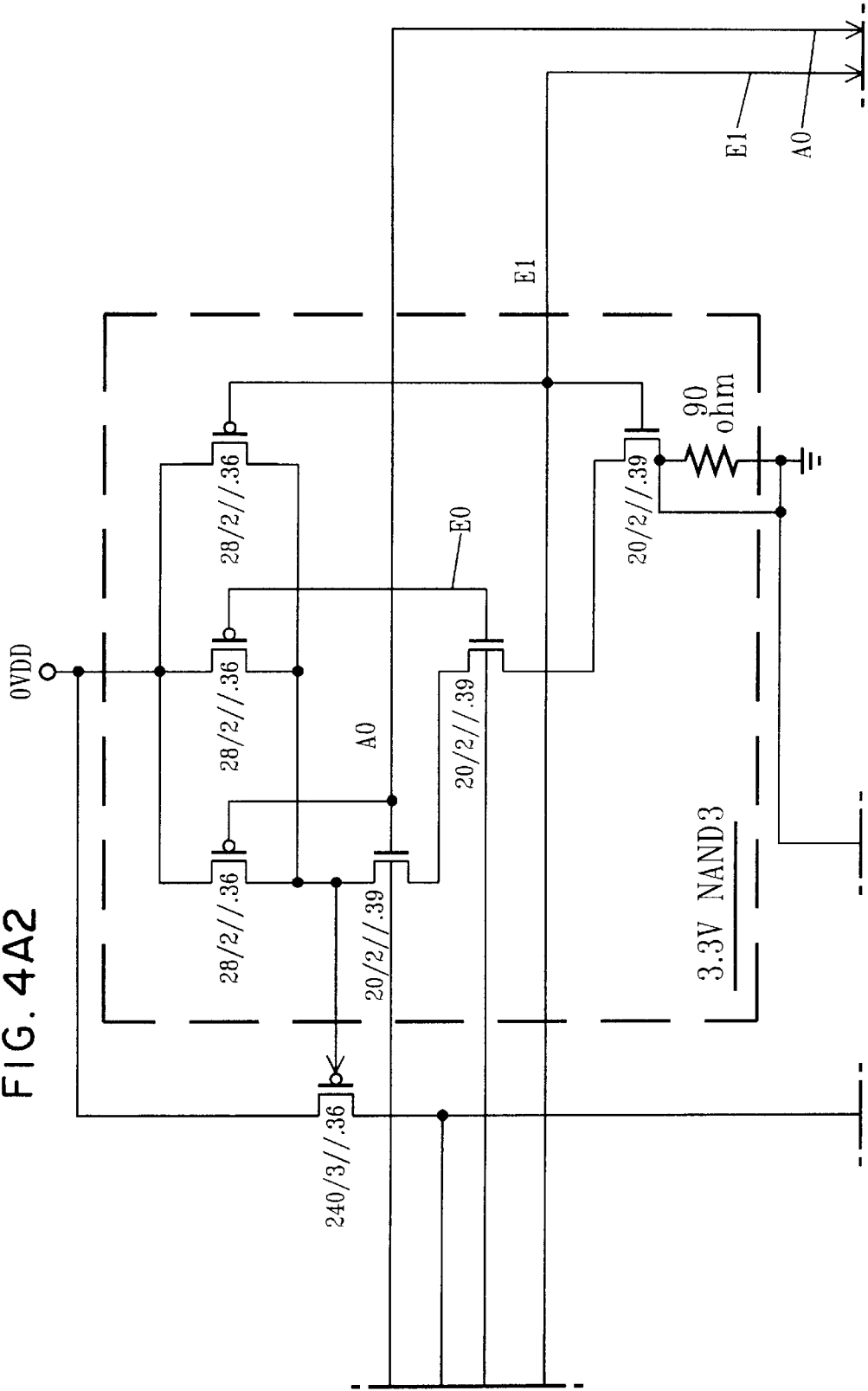
FIG. 4A2

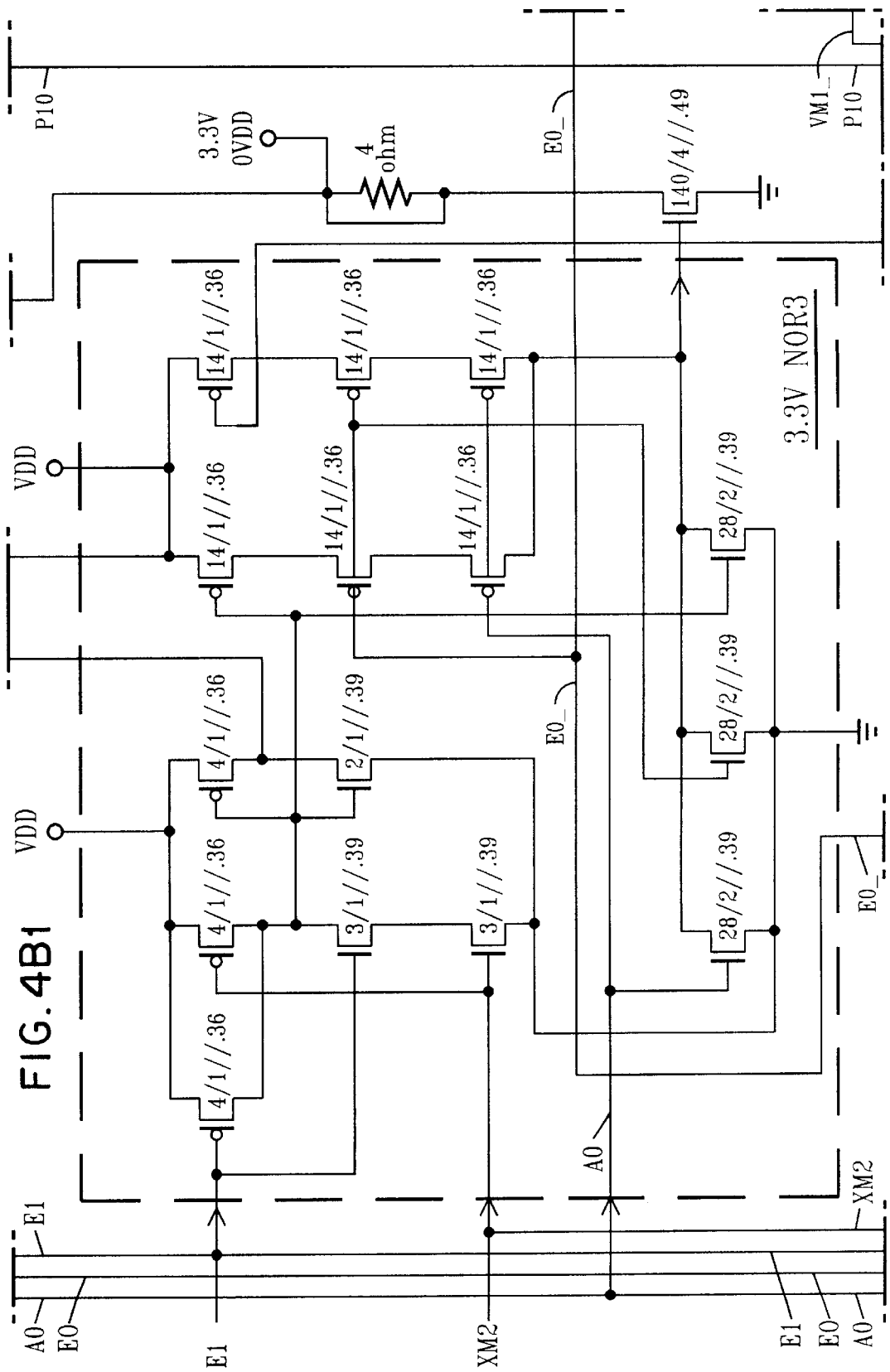
FIG. 4B1

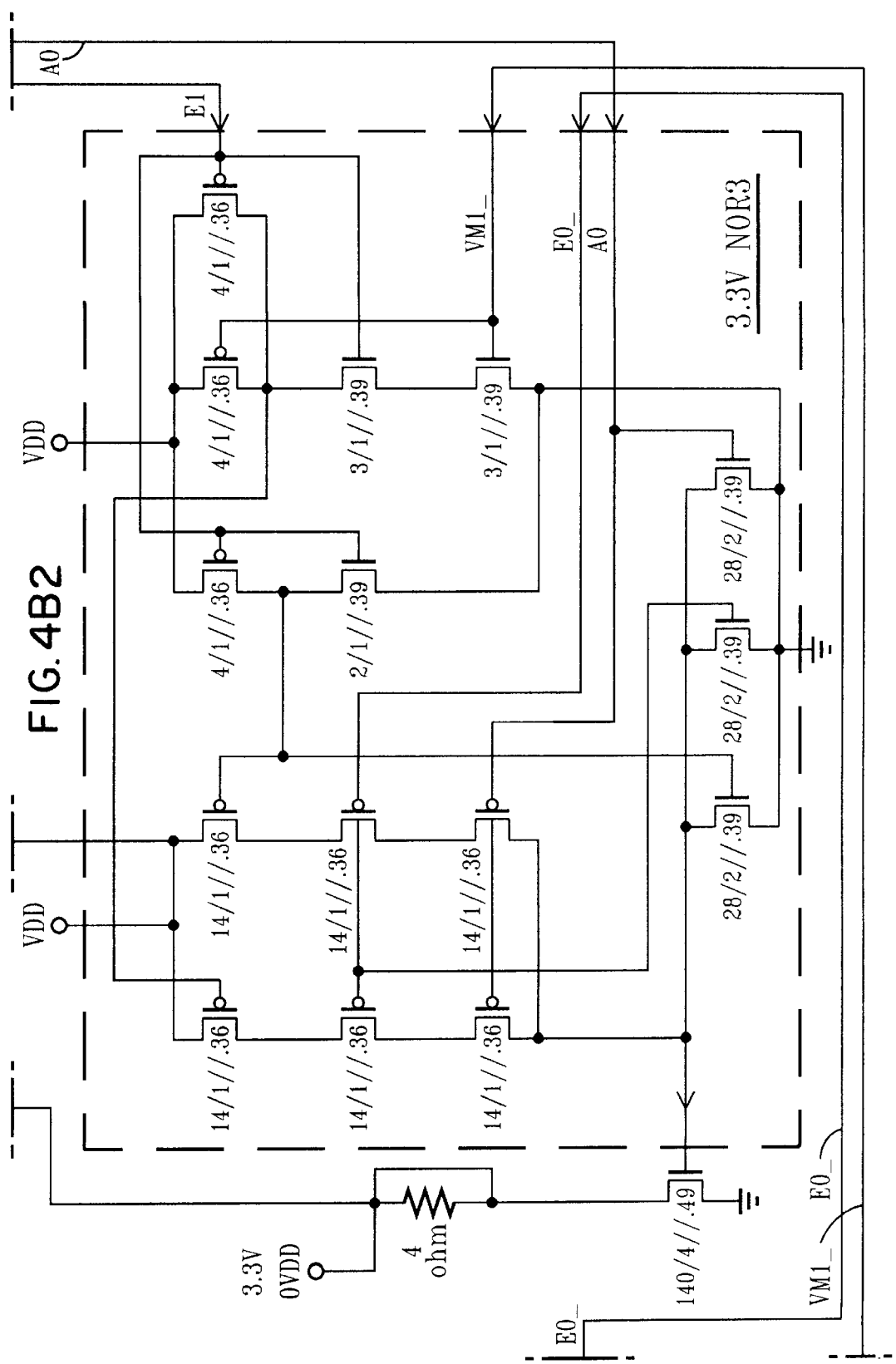
FIG. 4B2

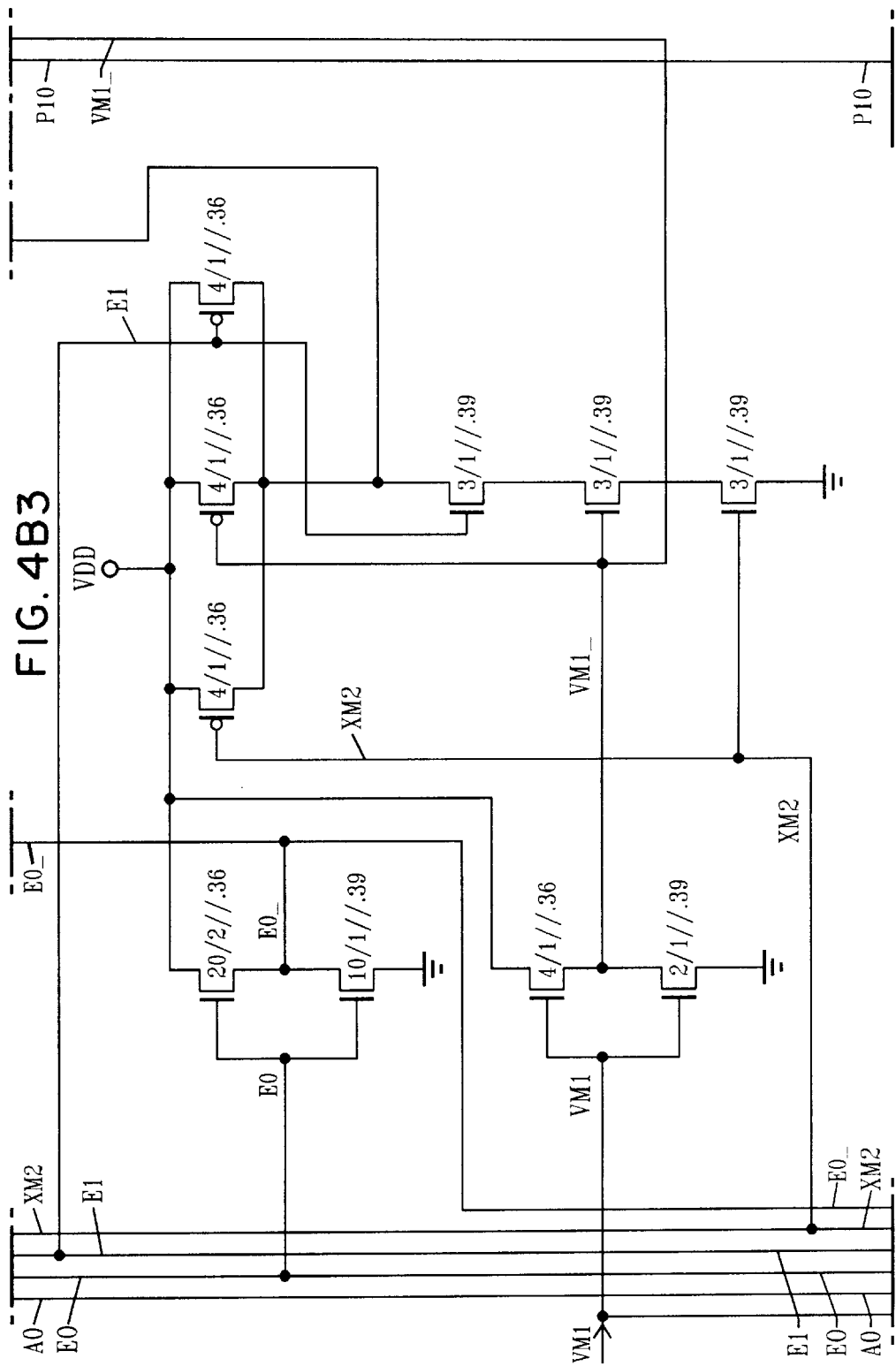
FIG. 4B3

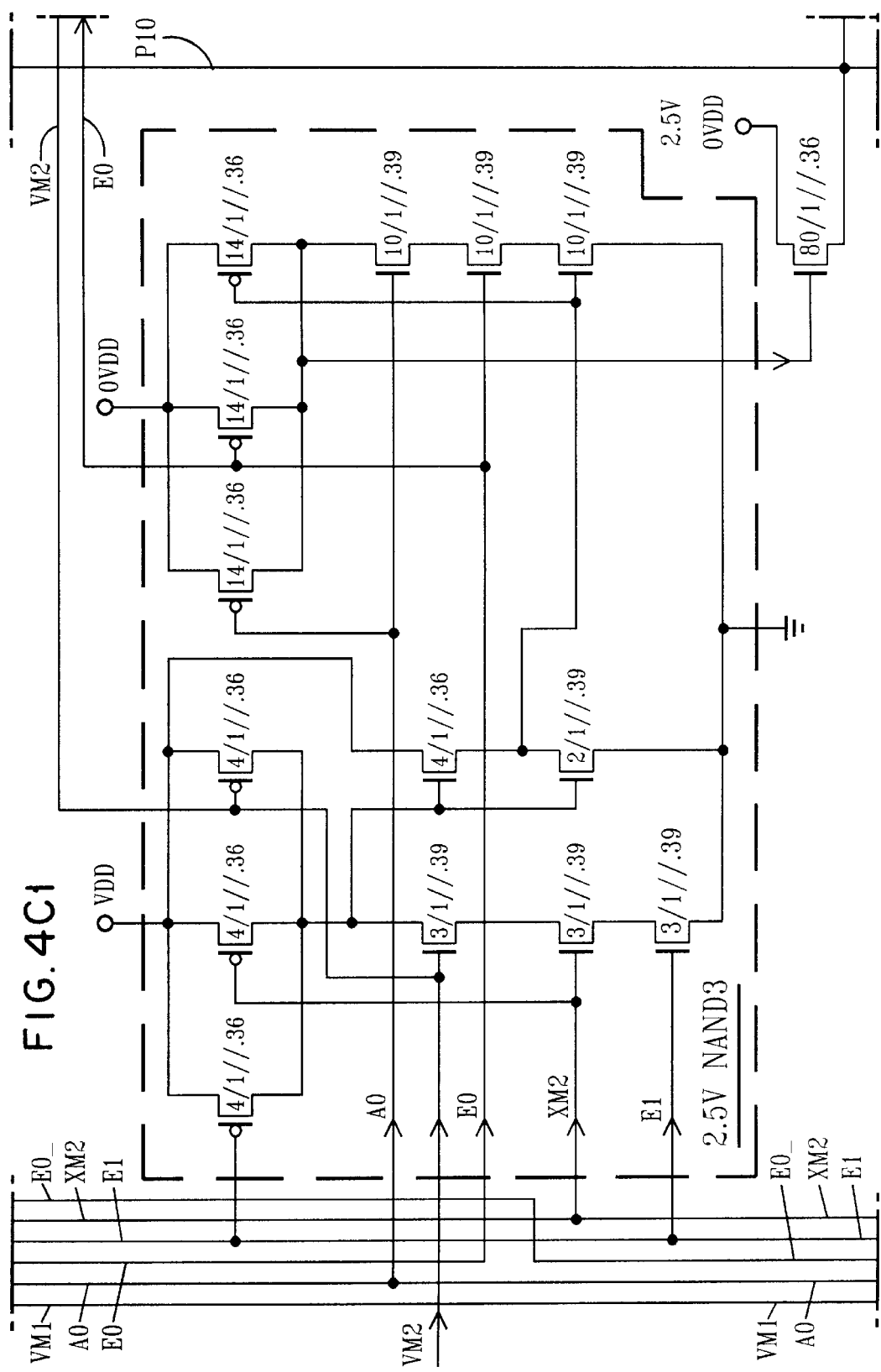
FIG. 4C1

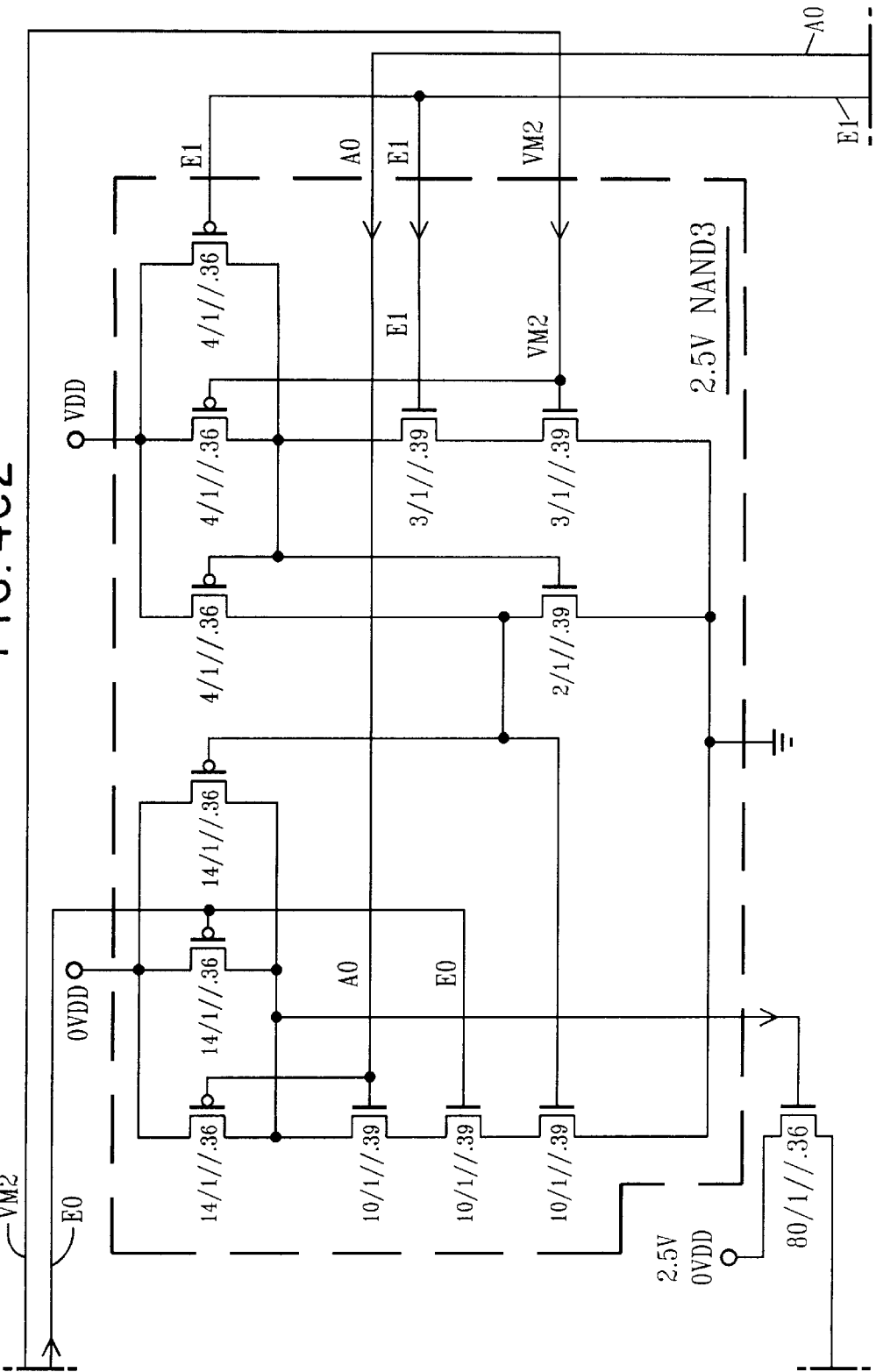
FIG. 4C2

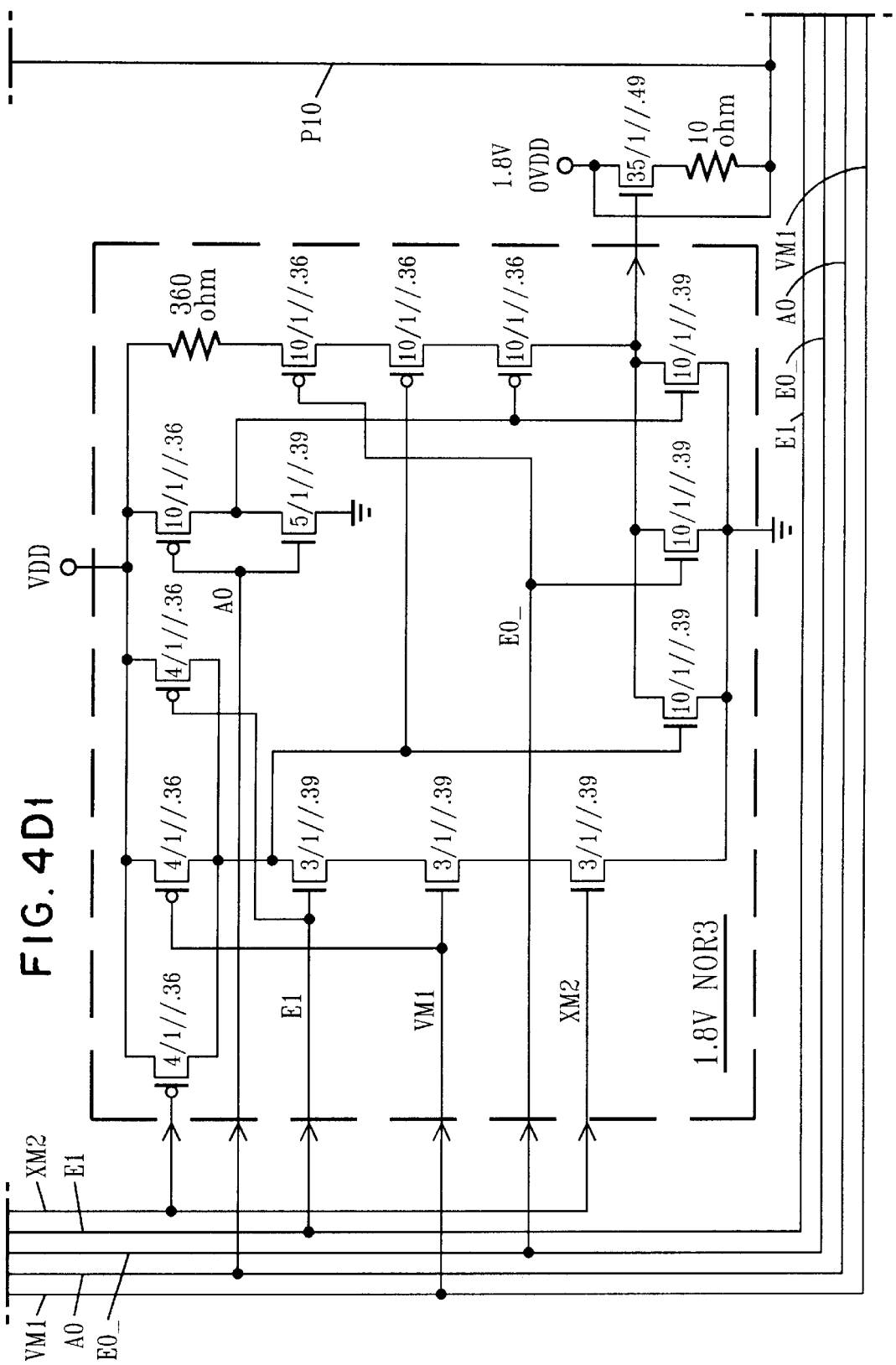
FIG. 4D1

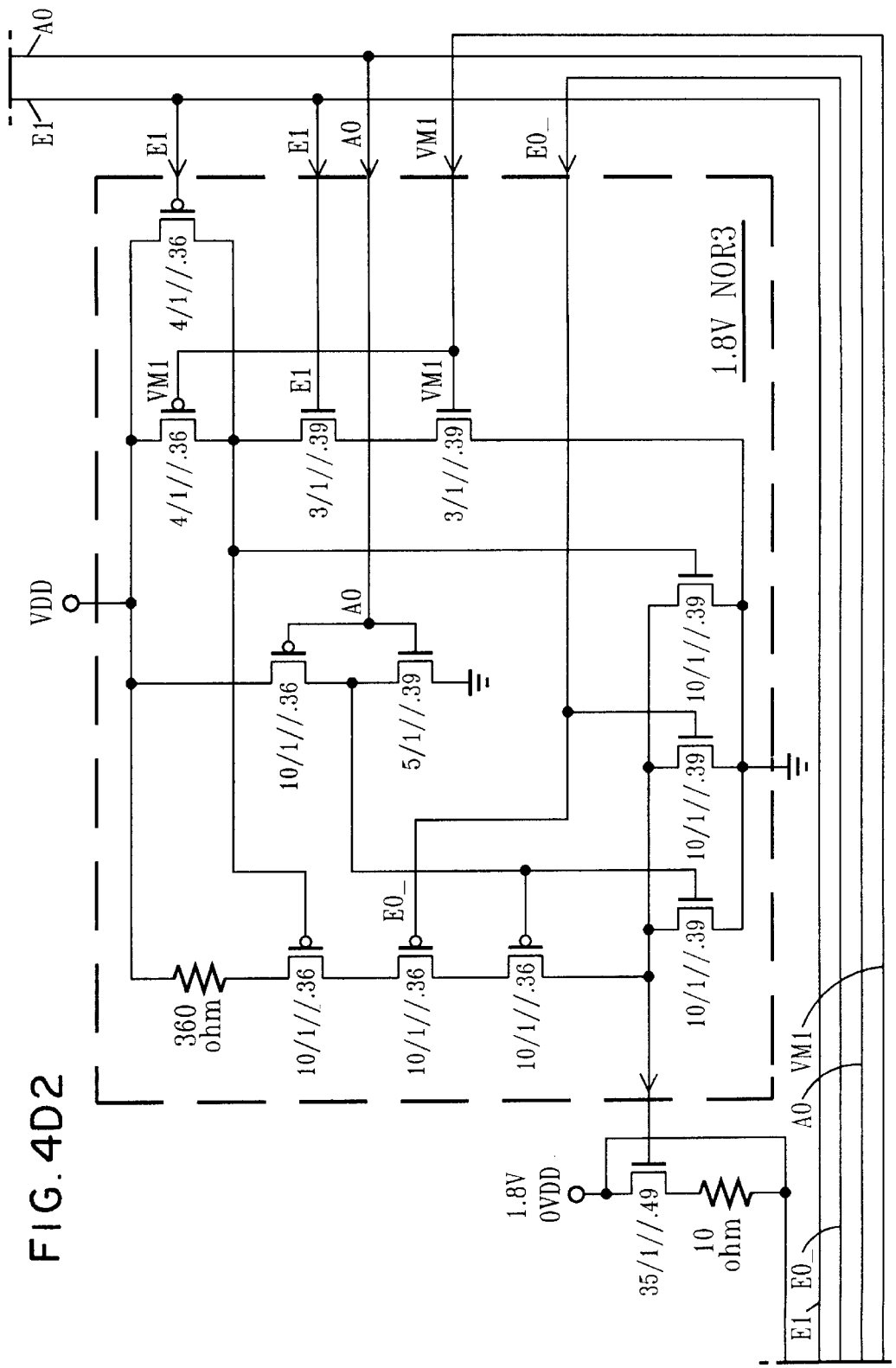
FIG. 4D2

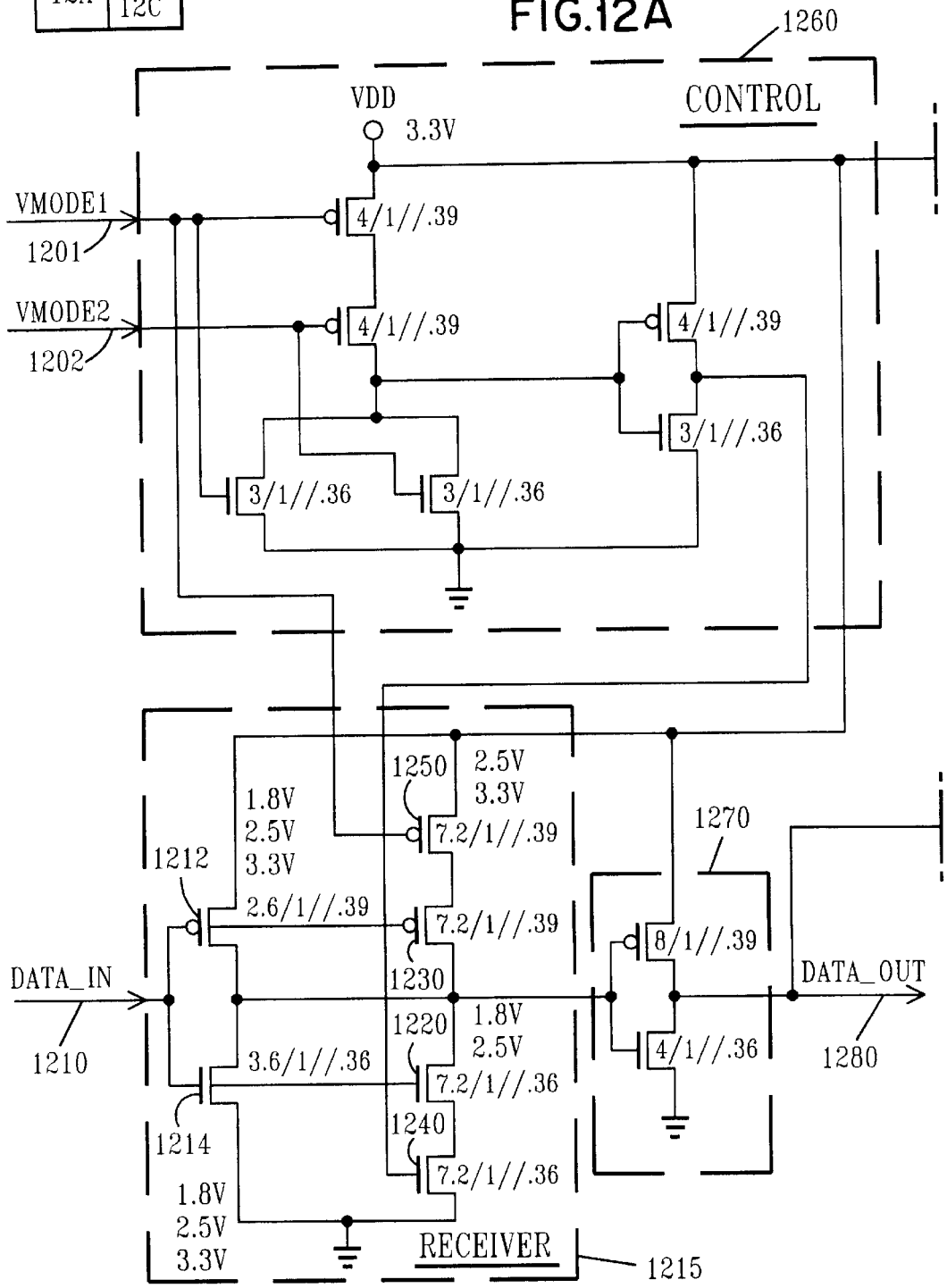

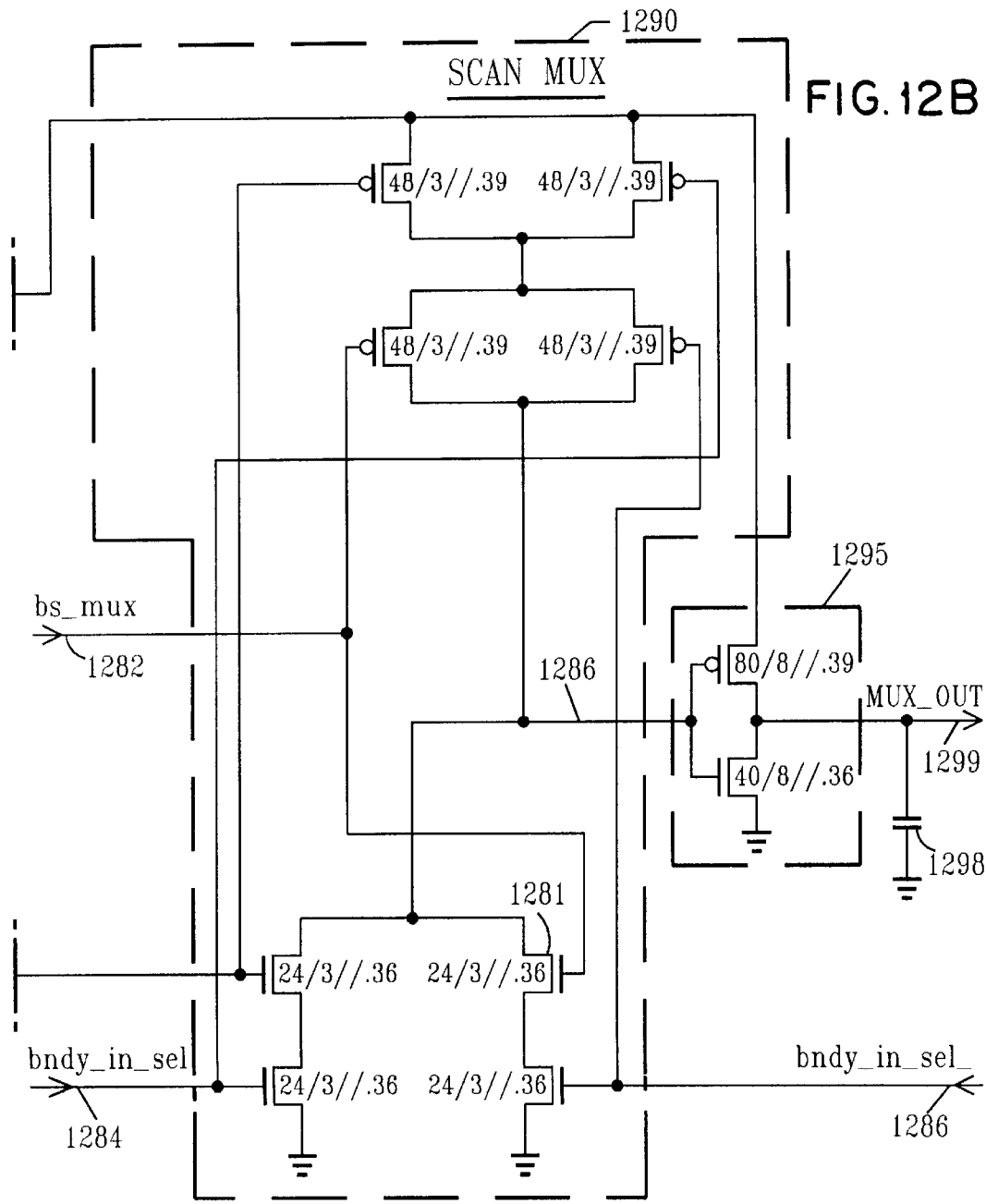

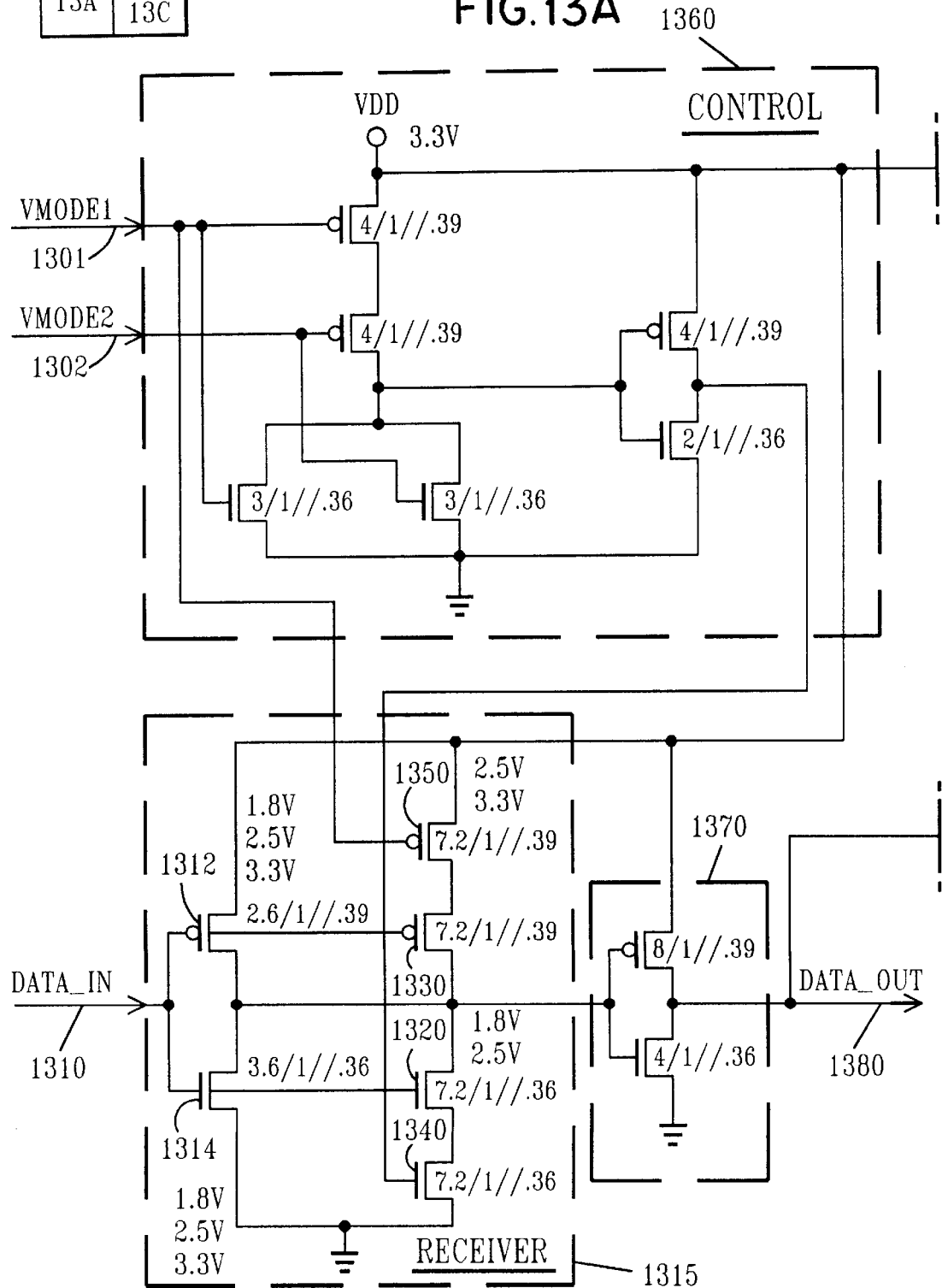

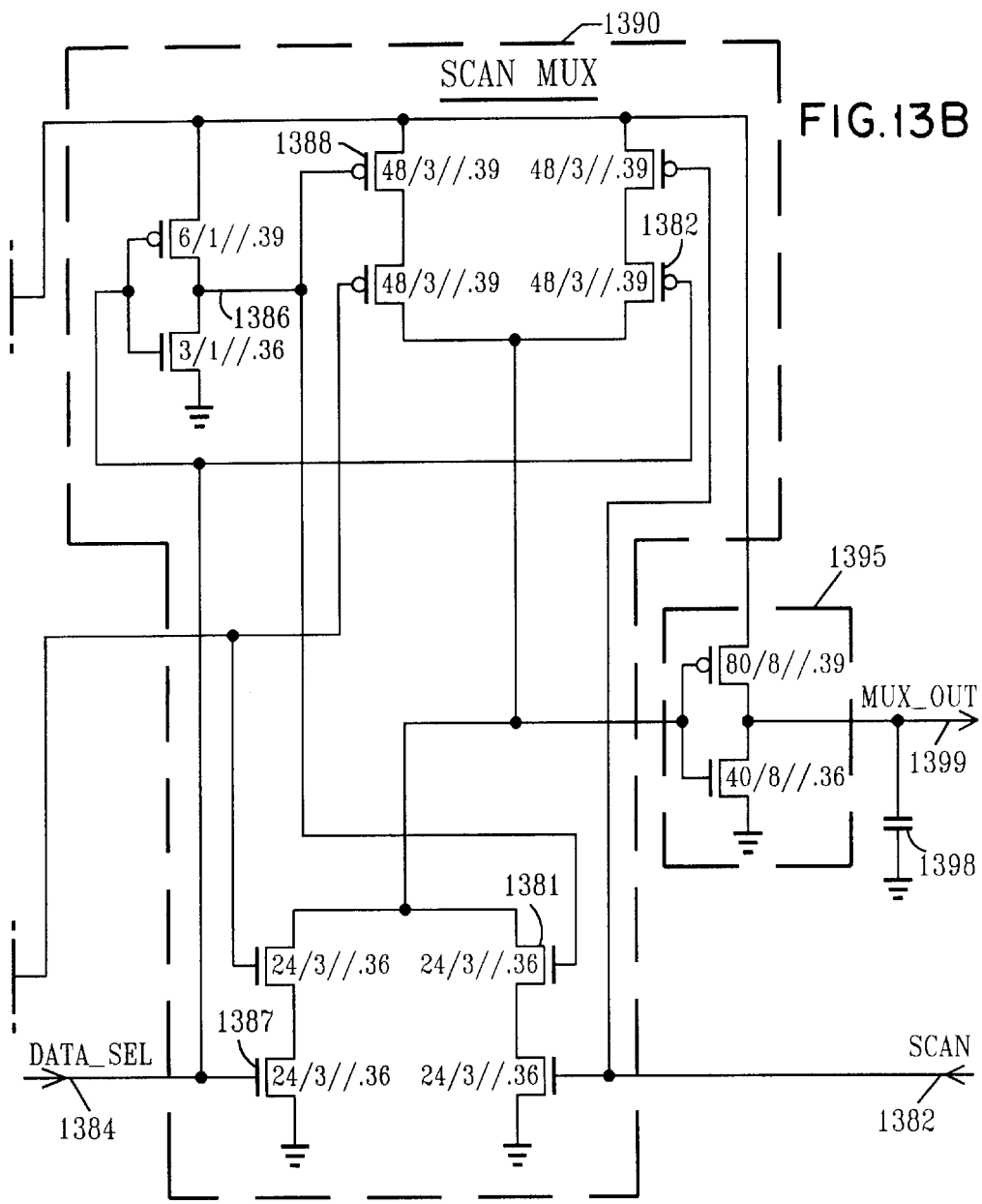

VARIABLE VOLTAGE, VARIABLE IMPEDANCE CMOS OFF-CHIP DRIVER AND RECEIVER INTERFACE AND CIRCUITS

TECHNICAL FIELD

The present invention relates to data processing systems, and more particularly to an improved method and apparatus for the communication between electronic devices to improve system cycle time, cost, and reliability. Modern high speed electronic systems often have chips of different internal voltage communicating with each other on a common bus. For example, because of intense competition in the microprocessor marketplace, there is great incentive for manufacturers to use the latest CMOS technology for the processor chip in order to achieve the highest possible clock frequency. However, the chips which provide memory and cache controller functions are often fabricated in the most cost effective technology, which is usually a generation or two behind the processor fabrication technology. In accordance with well established CMOS scaling principles, the supply voltage, VDD, is being reduced as the chip minimum lithography dimension is made smaller. Thus, 5 V technologies have been mostly supplanted by faster 3.3 V CMOS chips with a 0.35–0.5 micron minimum dimension. The next generation of CMOS (0.2–0.25 micron) will use a VDD of 2.5 V, with future scaling of supply voltage to below 2 V for subsequent generations of technology. Since it is best if all chips send and receive signals of the same voltage, this creates a problem. The common practice is to make all chips communicate at a 'high' voltage. For modern CMOS signals that would be either 3.3 or 5.0 V. This creates several problems for chips with lower internal voltage.

One problem is increased delay and chip area due to the need for voltage translation circuits. Another problem is that even with translation circuits, the thin oxide layers of the transistors are stressed by the high external voltage, and are operating very close to the failure limit.

A similar problem that occurs is compatibility between chips of different internal voltages but the same or similar function. For example, it is now common practice in the computer industry to 'remap' a chip into a lower voltage, faster silicon technology. Thus a processor chip with a 3.3 V internal voltage and a 0.4 micron gate length might be made with a more advanced silicon technology with a 2.5 V internal voltage and a 0.25 micron gate length, with a resultant increase in operating frequency and a decrease in chip power. The problem is that the first processor can communicate easily with 3.3 V SRAMs used for an external level 2 cache, but the 2.5 V processor may have communication problems and voltage translation circuits may have to be used. Similarly SRAM's are 'mapped' into lower voltage. It is a likely scenario for both a processor and an SRAM to have 2.5 V or even 1.8 V internal voltage and be communicating with 3.3 V external CMOS signals, with subsequent increased circuit cost, power, and delay. The higher external voltage can also cause decreased circuit reliability.

An alternative proposal is to have all chips communicate at a voltage lower than any internal voltage. An example is the 1.5 V HSTL (High Speed Tranceiver Logic) standard now before the Joint Electronic Device Engineering Council (JEDEC) and the Electronic Industries Association (EIA). This method requires complex packaging for simple systems where all chips have the same voltage. Moreover the small signal swings of this low voltage interface can be too small for chips of high power, i.e., a 2.5 V processor chip and a 1.5 V interface, with coupled noise between the internal circuits and the interface circuits causing false data to appear on system busses.

SUMMARY OF THE INVENTION

The present invention provides an arrangement between a plurality of electronic devices of the same or different internal voltages, which communicate between themselves. The design is particularly useful for electronic systems based on CMOS circuits. For the purposes of describing the invention we will refer to off-chip CMOS drivers and receivers (OCD's or OCR's) designed to either send or receive voltage pulses of either 0 or some positive voltages at a high frequency. We will make use of pFET (positive field effect transistor) and nFET (negative field effect transistor) devices, and resistors. The internal voltage (VDD) of the on-chip chip circuits will be 3.3 Volts, and the external or communication voltage (OVDD) will be either 3.3 V, 2.5 V, or 1.8 V.

Thus the OCD is based on traditional large pFET pullup devices (pFET with drain on the chip output and source on the off-chip voltage rail or OVDD) and large nFET pulldown devices (nFET with its source at ground and its drain on the chip output), with small nFET pullup devices used when OVDD=1.8 Volts. The gates or inputs to the large pFETs are 3 way NAND (inverting three input logical 'and' circuits), designed to drive slowly to ground but quickly to OVDD. The gates or inputs to the large nFETs are 3 way NOR (inverting three input logical 'or' circuits), designed to drive slowly to VDD but quickly to ground. With such a design there is essentially no time when both the nFET and pFET output devices are both conducting, thus minimizing the current from VDD to ground through the devices. The output of the nFET has a small series resistor, before contacting the electrostatic discharge diode structure (ESD). The series resistor serves both to match driver output impedance to roughly half of the impedance of the load circuit, and to reduce the voltage induced on the nFET device during a 'spark', or ESD event. The turn-on of the large pullup devices (the 3.3 V pFET and the 1.8 V nFET) is controlled by the use of a resistor between the stacked gate drive devices and the reference voltage. The selection of which voltage to drive can either be controlled externally, or by direct detection of the VDD and OVDD rail voltages.

Both the large pFET and nFET devices are arranged as 2 parallel devices. One of the two parallel devices is used when a high impedance output driver is desired, for example when driving a lightly loaded net with perhaps just two chips communicating. Both parallel devices are driven when a stronger, lower impedance driver is required, for example when driving a highly loaded bus with multiple chips on it. The configuration line (or lines) to change driver impedance may be brought external to the chip and used to control the impedance of drivers on a common bus, as new units are inserted on the bus.

The OCR is based on a variation of a traditional CMOS inverter. The receiver input is connected to the gates of a small pFET pullup with source connected to VDD, and a small nFET pulldown device with source connected to ground. The threshold, or switch point of the inverter is determined by the relative size of each device. To adjust the threshold, each device is comprised of 2 parallel devices. One of the parallel device is always present, the other is switched in or out depending on the value of OVDD. There are 4 inverter stages to the receiver. The final stage inverter drives into the chip logic. The 3rd internal stage is used to perform a multiplex (mux) function with a test data input, so that data from either the chip input, or data from an internal register, can be used to drive the internal chip logic.

The devices are used as follows. In our preferred embodiment chips of the same or different internal voltages are connected together on a common bus. The lowest possible internal voltage is 1.8 V and the highest possible internal voltage is 3.3 V. Clearly this technique is not restricted to these choices, we chose these values as representative of high speed electrical systems being designed today. We imagine that OCR's and OCD's of this style, i.e., variable voltage from the internal power rail voltage down to a a small voltage, 1.8 V in our preferred embodiment, are used on any device CMOS chip whose internal voltage is larger than 1.8 V. A chip whose internal voltage is 1.8 V does not require variable voltage, and has both internal and external power rails and circuits connected to the same 1.8 V supply. The communication voltage, or voltage of the linked off-chip OCR's and OCD's, is equal to the internal voltage of the chip with the lowest internal voltage.

The OCR and OCD designs shown have been incorporated into a 3.3 V, 0.5 micron minimum gate dimension CMOS memory controller for use in data processing equipment.

It is therefore an object of the present invention to provide an arrangement of a plurality of electronic devices sharing a bus, or a common set of communication lines, that can allow for a change in the internal voltage of any of the devices, such as results when one changes to a lower voltage device technology.

It is yet another object of the present invention to have this flexibility with a reduced set of support devices such as power supplies or termination resistors.

It is yet another object of the invention to retain the traditional communication level, i.e., CMOS signaling, when all internal voltages of the chips communicating on the bus are the same.

It is yet another object of the invention to accommodate for changing the communication voltage on the bus in an automatic fashion.

It is therefore an object of the present invention to provide an arrangement of a plurality of electronic devices sharing a bus, or a common set of communication lines, that can allow for a change in the output impedance of the devices, such as is desirable when additional devices are placed on the bus.

It is therefore an object of the present invention to have this impedance change occur automatically, with installation of the additional devices.

It is yet another object of the invention to have this flexibility in communication voltage or driver impedance without significant added signal delay.

It is yet another object of the invention to have this flexibility in communication voltage or driver impedance with improved system reliability.

It is yet another object of the invention to have this flexibility in communication voltage or driver impedance with improved system cost.

It is yet another object of the invention to have this flexibility with no changes required other than to provide the new voltage.

It is yet another object of the invention to make the communication voltage be equal to or less than the internal voltage of all devices on the bus.

It is yet another object of the invention to make the communication voltage equal to the lowest internal voltage on the bus.

It is yet another object of the invention to provide improved signal quality in the system.

These, and other, objects and advantages of the present invention will now be described, with reference to the following drawings, in which:

BRIEF DESCRIPTION OF THE DRAWINGS

FIG. 4 shows a device level schematic of the variable voltage, variable impedance CMOS driver of FIG. 3.

FIG. 12 shows a detailed schematic of a 4 stage variable voltage, high impedance CMOS receiver with a test data mux function.

FIG. 13 shows a detailed schematic of a 4 stage variable voltage, high impedance CMOS receiver with an improved test data mux function.

DETAILED DESCRIPTION OF THE PREFERRED EMBODIMENT

Figure 1:
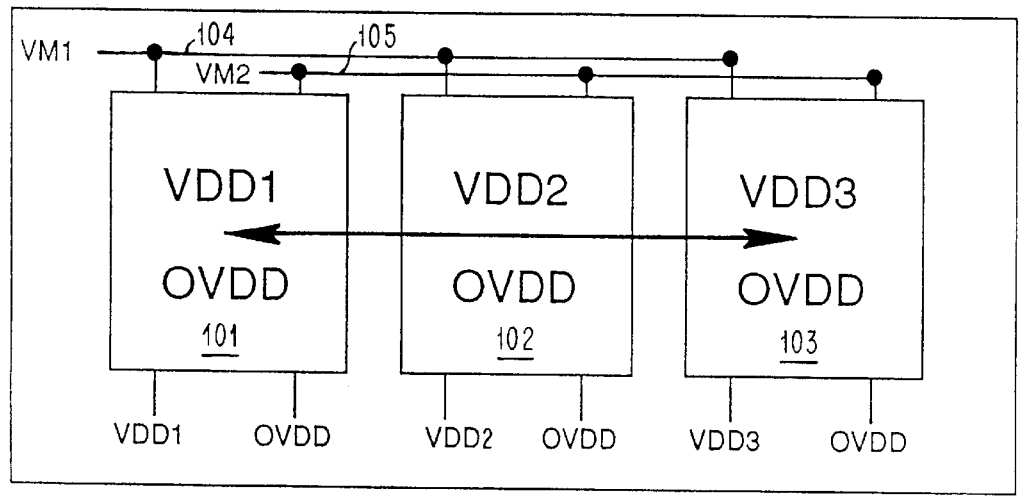
FIG. 1 shows a high level schematic of a high speed electronic system with 3 electronic devices of same or different internal voltages, communicating with a common voltage equal to the lowest internal voltage on the bus.

The driver and receiver circuits described below are preferred for use in the situation described by FIG. 1. Here 3 chips, 101, 102, and 103, run with internal voltages VDD1, VDD2, and VDD3 respectfully. We will be describing the invention in terms of CMOS chips and CMOS off-chip drivers and receivers, but the design principles are valid for other systems and technologies as well. All chips send and receive data at a second, external voltage, OVDD. Thus signals which are common to all chips are communicated at a common external voltage OVDD, as shown. This voltage is variable in the sense that the external voltage or communication voltage OVDD is equal to the minimum of the internal voltages of all chips on a common bus. Thus in FIG. 1 the chip with the lowest internal voltage, chip 103, has the same internal and external voltage.

No chip is required to drive or receive a voltage larger than its internal voltage. This removes most of the overhead of voltage translation circuits in terms of chip area and delay, and removes over-voltage reliability concerns. Moreover the lowest voltage chip can drive and receive voltages at its internal voltage, and has no voltage translation circuits and only one set of internal and external power rails. Since in general the lowest voltage chip is also the highest power, fastest, and most expensive chip (the processor chip if this is a modern computer system), the chip which wants to have the least complexity, highest reliability, and fastest speed is allowed to do so. The communication voltage can be set by digital levels (signal pins), or, if desired, it can be generated internally on the chip by sampling the voltage of the external power rails. In FIG. 1 the control signals VM1 and VM2 are shown bussed together as nets 104 and 105. These same signals will be shown in the driver design of FIG. 3 and the receiver design of FIG. 12. These signals may also be derived internally, on each chip. For example if VDD1 on chip 101 was 3.3 V, then the circuit shown in FIG. 11 could be used to generate these control signals directly from the voltages on VDD1 and OVDD.

Figure 2:
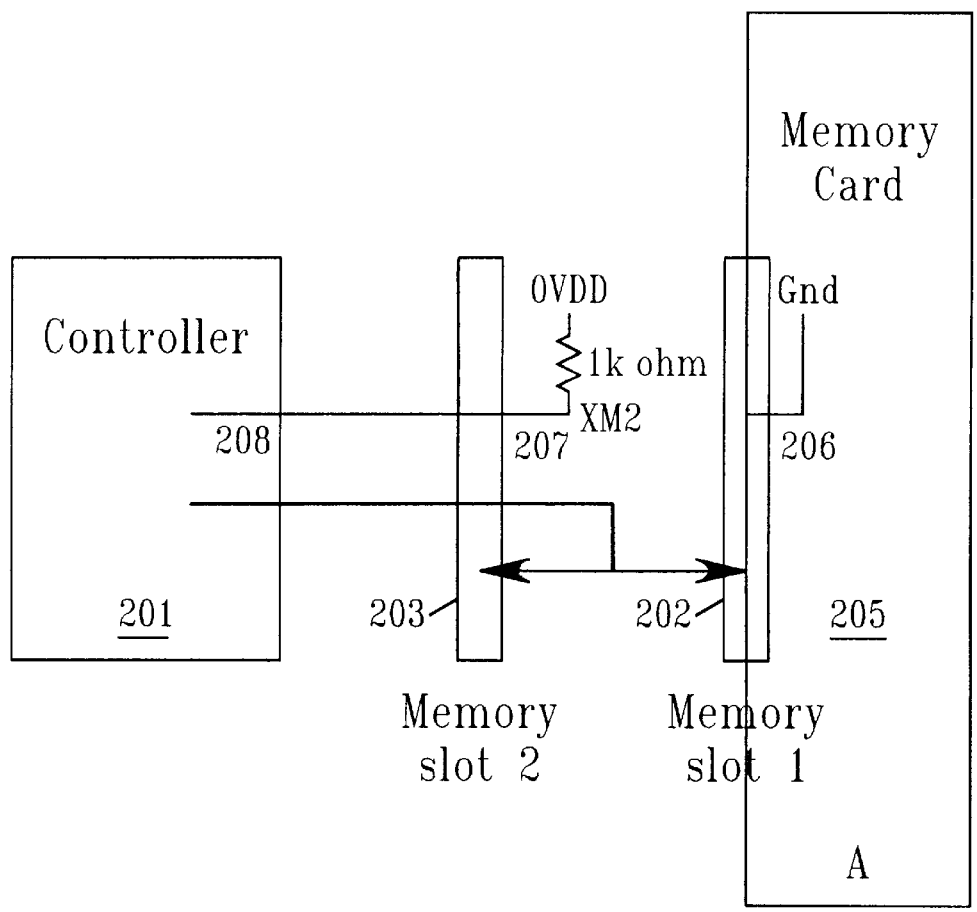
FIG. 2 shows a high level schematic of a controller chip with a variable impedance output driver, with the control line wired to that the driver impedance changes to match the variable impedance load circuit, in this case 1 or 2 memory cards.

It is desirable to have drivers of variable impedance, or drive strength, to support systems with varying driver loads. This is shown schematically in FIG. 2, where controller chip 201 is driving a memory bus. The bus connects to two circuit card connectors 202 and 203. One card slot, 202, always contains a circuit card, in this case memory card 205. If a similar memory card is also placed in slot 2, or connector, 203, then signal pin 206 which is tied to ground contacts connector pin 207 of slot 2 which is being pulled high, to OVDD, through a large resistor. The result is the control line XM2 connected to signal pin 208 of the controller chip 201 has a 0, or is connected to ground, when both slots are filled. It has value 1, or is connected to OVDD, when only slot 1 is filled. This impedance control line XM2, or signal 208, is observed also in the driver schematic of FIG. 3 and detailed driver schematic of FIG. 4, where it changes the CMOS output driver impedance from a nominal impedance of 42 ohms (high impedance) to a nominal impedance of 25 ohms (low impedance).

Figure 3:
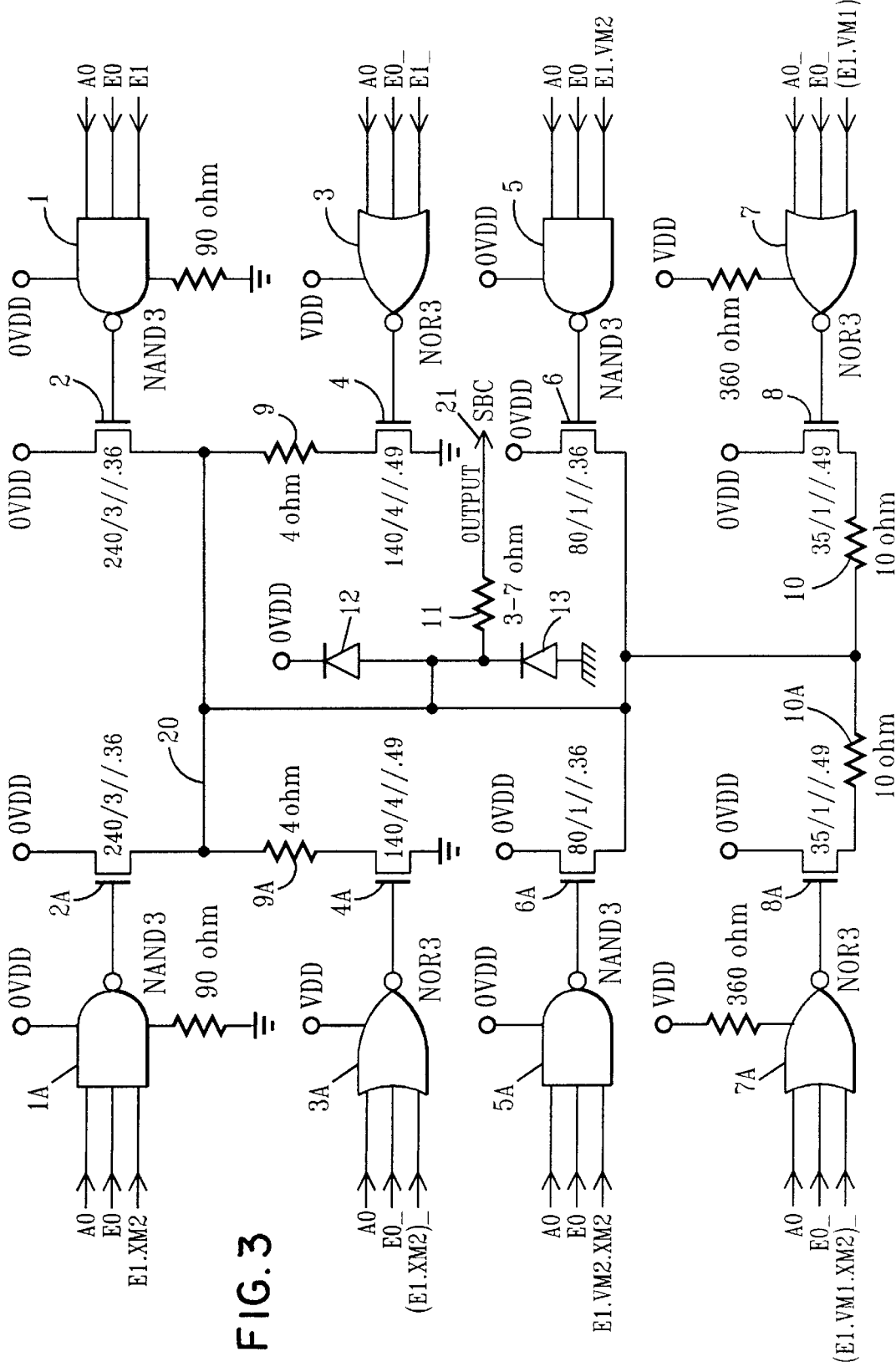
FIG. 3 shows a high level schematic of a variable voltage, variable impedance CMOS driver.

The driver consists of logic and pre-drive circuits connected to output devices as shown in the schematic of FIG. 3. FIG. 4 is a more detailed schematic of the driver design; all of the logic and pre-drive circuitry is expanded in FIG. 4 to show the implementation details of the same driver design in FIG. 3. The driver operates in both high output impedance and low output impedance modes. In each mode, it can drive output levels of 0 to 1.8 V, 0 to 2.5 V, and 0 to 3.3 V. The driver is connected to the chip core supply VDD, and an output supply OVDD which both share a common ground connection.

The driver output stage consists of two stacks of nFET and pFET devices connected in a normal CMOS configuration with the pFET used as a pull-up, and the nFET as a pull-down. In addition, a parallel nFET pull-up device is used for each impedance mode to provide additional current drive capability in the 1.8 V case.

For basic driver operation at 3.3 V output levels, devices 2 and 4 form the CMOS output stage for the high impedance mode, and the parallel combination of devices 2, 2A and 4, 4A form the CMOS output stage for the low impedance mode. Resistor 9 in series with device 4, and resistor 9A in series with device 4A are used for adjusting the output impedance during pull-down in the high and low impedance modes, respectively. When driving 3.3 V signals, output devices 6, 6A, 8, and 8A are not selected by the pre-drive logic. The output of the driver, 21, is connected to the chip substrate (not shown). The output of the final stage inverters are connected together, as shown by interconnect 20.

For driver operation at 2.5 V output levels, an additional pFET pull-up, device 6, is selected by the pre-drive logic of NAND gate 5 in addition to devices 2 and 4 as described above. Similarly, when in low impedance mode, an additional pFET pull-up, device 6A, is selected by NAND gate 5A in addition to devices 2, 2A, 4, 4A and 6 as described above. When driving 2.5 volt signals, output devices 8 and 8A are not selected by the pre-drive logic.

For driver operation at 1.8 V output levels, an additional nFET pull-up, device 8, is selected by the pre-drive logic of NOR gate 7, in addition to devices 2, 4 and 6 as described above. Similarly, when in low impedance mode, an additional nFET pull-up, device 8A, is selected by NOR gate 7A in addition to devices 2, 2A, 4, 4A, 6, 6A and 8 as described above. Resistor 10 in series with device 8, and resistor 10A in series with device 8A are used for adjusting the output impedance during pull-up in the high and low impedance modes, respectively. Thus, when driving 1.8 V signals, all output devices are selected by the pre-drive logic.

The desired driver output impedances for both the low and high impedance modes can be adjusted by choosing the output device widths (devices 2, 2A, 4, 4A, 6, 6A, 8, and 8A), and by selecting the values of resistances 9, 9A, 10, 10A. These resistors, which are all in series with nFET output devices, also provide additional electro-static discharge (ESD) protection. Resistor 11 represents the series resistance of the on-chip metal line connecting the driver circuit output node to the chip output pad, and is also controlled within an acceptable range since it contributes to the driver output impedance.

Control signals for the driver are provided by signals E0, E1, VM1, VM2 and XM2. E0 and E1 are enable signals. VM1 and VM2 are used to select the operating signal voltage range as described below. XM2 is used to select the driver output impedance. The data input for the driver is A0, and the driver output is taken from node SBC. Also shown in FIG. 3 are ESD protection diodes 12 and 13 connected from the output to OVDD and ground, respectively.

Figure 5A:
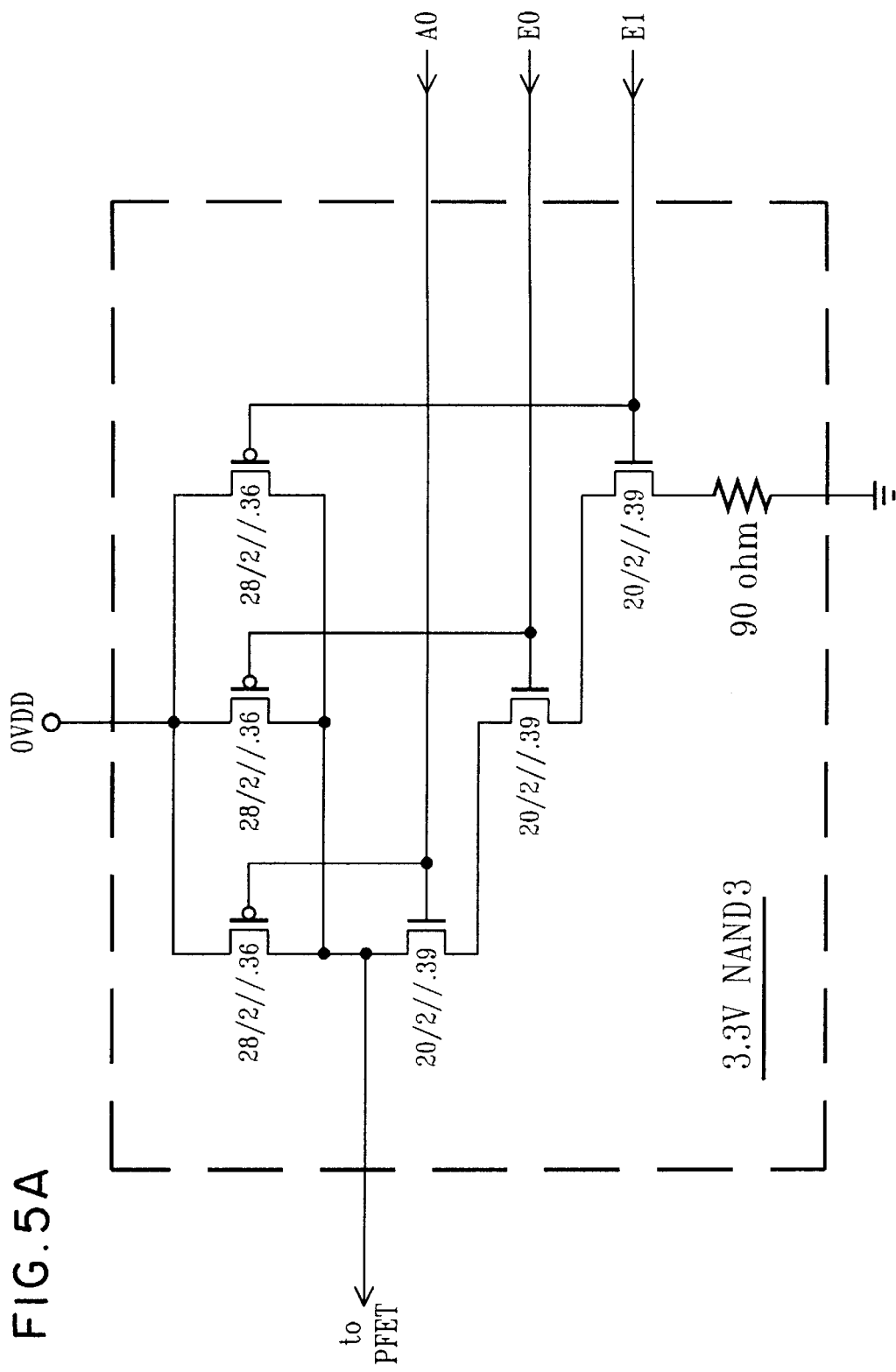
FIG. 5 shows the device level schematic for the 3 input NAND (1) and 3 input NOR (3) 3.3 V predrive logic of FIG. 3.
Figure 5B:
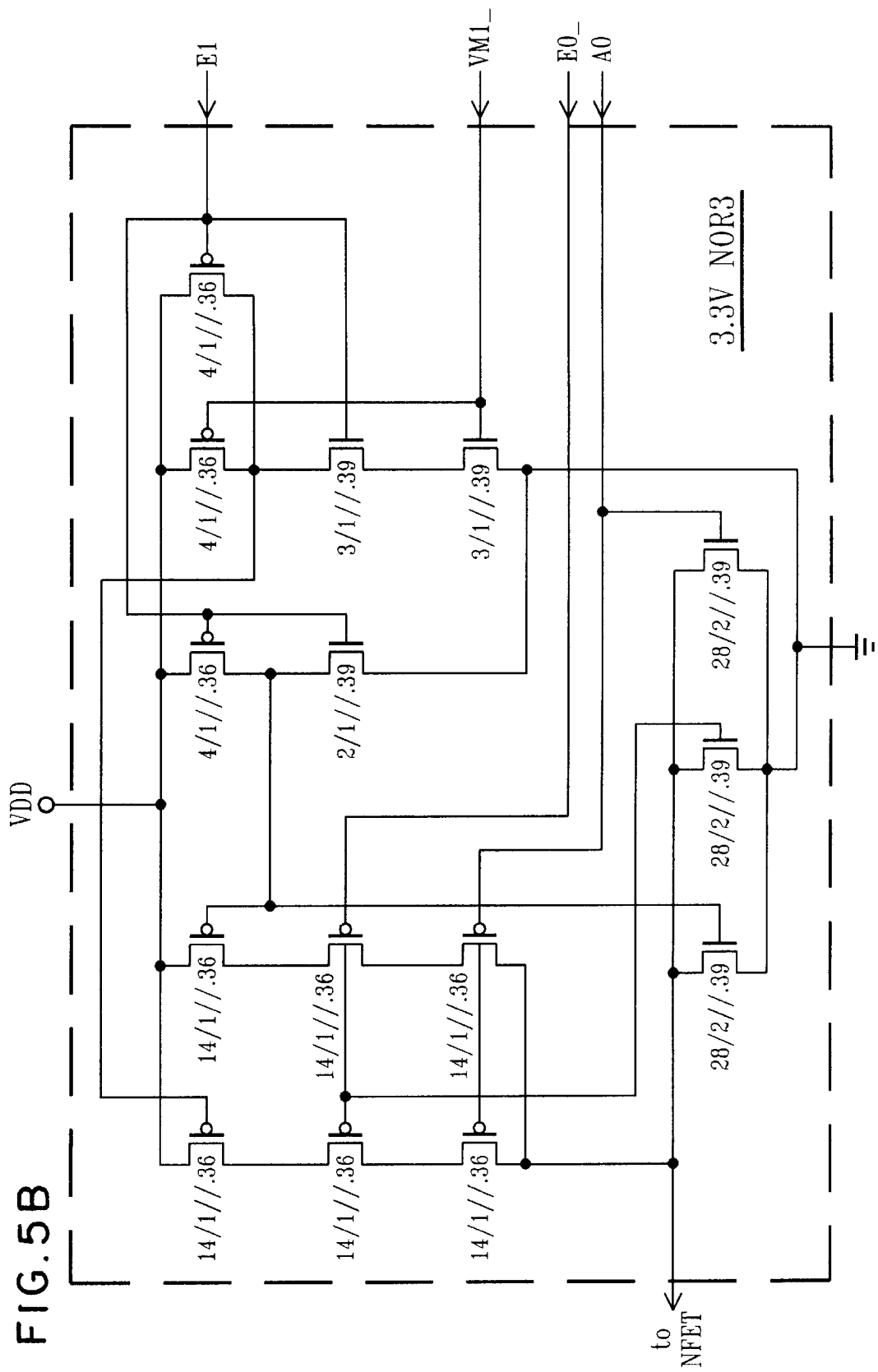
Figure 6A:
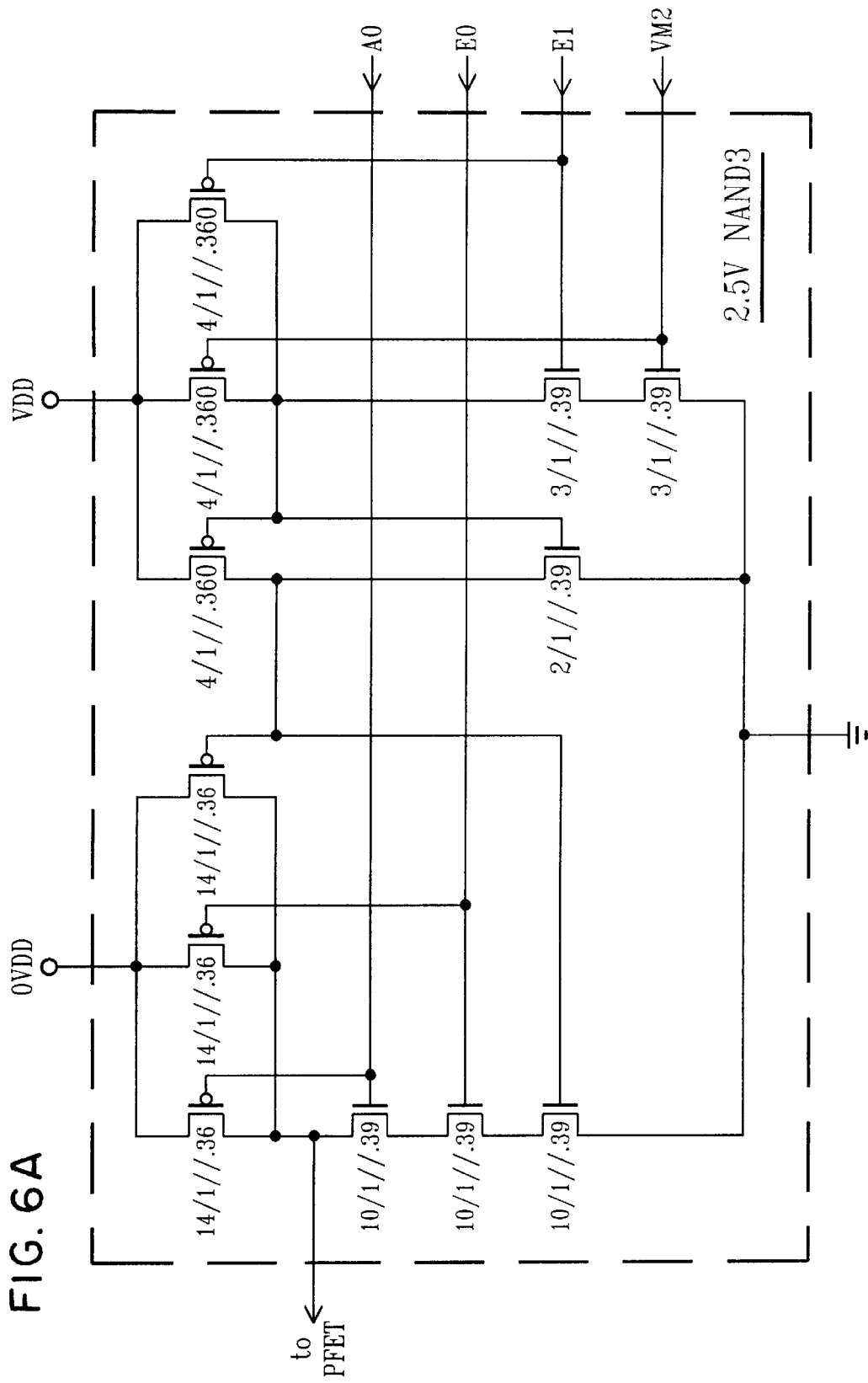
FIG. 6 shows the device level schematic for the 3 input NAND (5) and 3 input NOR (7) 2.5 V and 1.8 V predrive logic of FIG. 3.
Figure 6B:
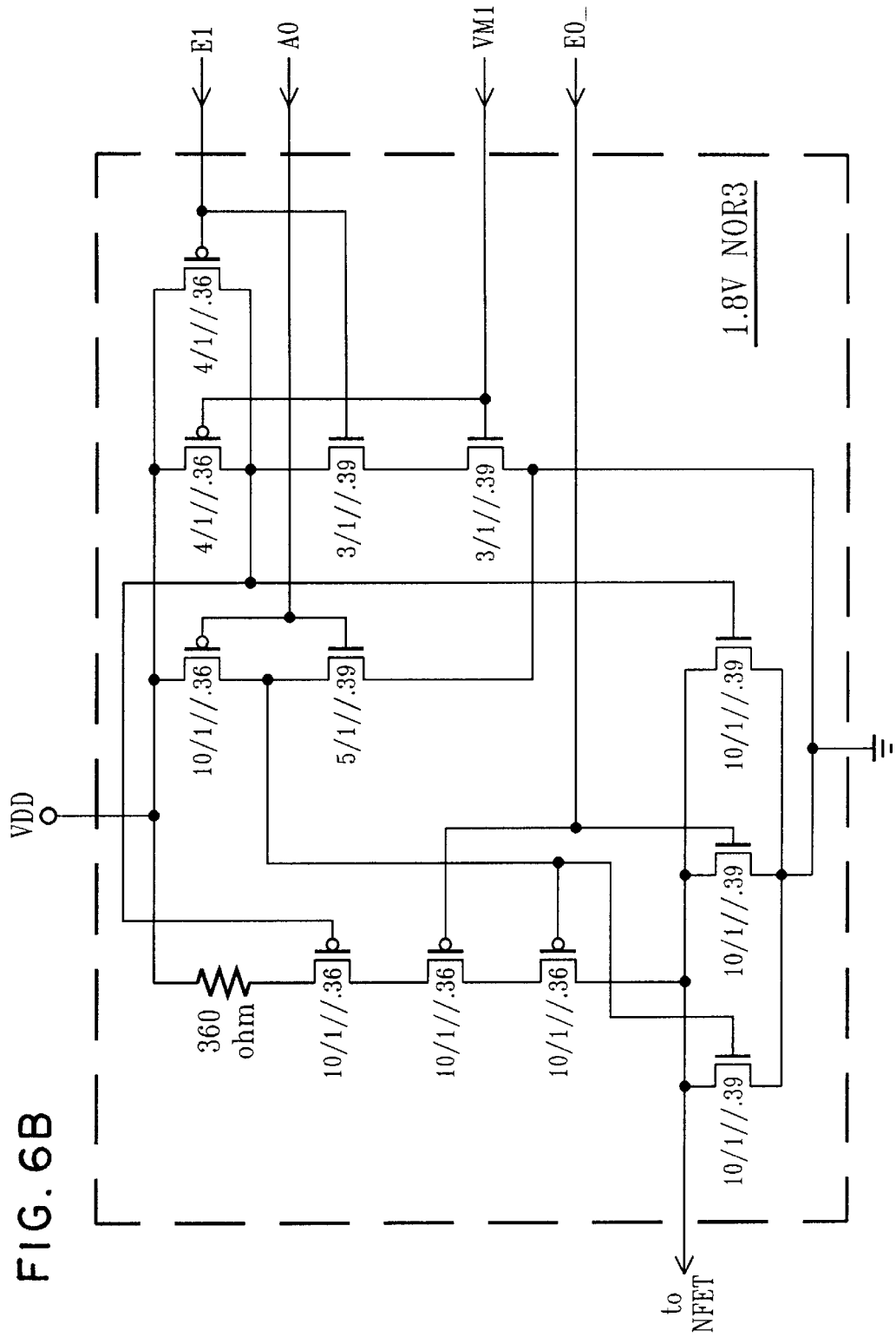

The pre-drive circuits generate the required drive signals to the gate of each output pull-up or pull-down device. The pre-drive logic uses the control signals to select which output devices are to be driven for any given output voltage mode or impedance level. The pre-drive circuitry must be designed such that the nFET output devices be turned off quickly, before turning on the pFET output devices during a low to high transition. If both pull-up and pull down devices were turned on simultaneously, they would conduct shoot-through current from OVDD directly to ground which would dissipate excess power, and could pose reliability concerns. Conversely, during a high to low transition, the pre-drive circuitry must turn off the pFET output devices before turning on the nFET output devices to avoid shoot-through current. These undesirable conditions are avoided by proper design of the pre-drive logic as shown in FIGS. 5 and 6. Since the output nFET devices are all driven by NOR gates, these devices are turned off by devices in parallel (fast), and are turned on by devices in series (slow). For the output pFET devices, the pre-drive circuits are all NAND gates; these devices are thus also turned off by devices in parallel (fast), and are turned on by devices in series (slow). By choosing approximately equal device widths in the pull-up and pull-down paths of these NAND and NOR gates, the proper sequence constraints described above are satisfied, and shoot-through current is avoided. In addition, the size of the pre-drive transistors is chosen to minimize block delay without exceeding acceptable limits on switching current, di/dt.

By powering the pre-drive NAND gates from OVDD as shown in FIGS. 5 and 6, the proper sequence is maintained for turn-on, and turn off, of the output pFETs as OVDD is varied. However, to avoid excessive delay in turning on the output nFETS, it is necessary to power the pre-drive NOR gates directly from VDD. This introduces a potential problem in that the nFET turn on is considerably faster when operated at 3.3 V OVDD. This could lead to a shoot-through problem. The problem is avoided by a modification of the NOR circuits 3 and 3A of FIG. 3. A detailed schematic of the 3.3 V pre-drive NOR circuit, 3, is shown in FIG. 5. The series pFET stack of a NOR is split into two stacks in parallel shown as devices Q103, Q106, Q105 and Q107, Q104, Q102. The Q103, Q106, Q105 devices are only active when in 1.8 V mode. The logic to enable these devices is generated by a NAND gate made up of devices Q247, Q248, Q245 and Q246 shown in FIG. 5. The device widths are selected to prevent too fast turn-on and potential shoot-through problems in 2.5 V and 3.3 V modes, and to achieve acceptable delay in 1.8 V mode.

For basic driver operation at 3.3 V output levels in the high impedance mode, the pull-up pre-drive is provided by NAND gate 1 with inputs A0, E0 and E1. Thus, both E0 and E1 signals must be active (high) for the data, A0, to be driven. Similarly, the pull-down pre-drive is provided by NOR gate 3 with inputs A0, E0_ and E1_, and again both E0 and E1 signals must be active (high) for the data, A0, to be driven. For driver operation at 3.3 V output levels in the low impedance mode, additional pull-up pre-drive is provided by NAND gate 1A with inputs A0, E0 and E1.XM2. Thus, in addition to E0 and E1, signal XM2 must also be active (high) for the data, A0, to be driven by device A1 Similarly, additional pull-down pre-drive is provided by NOR gate 3A with inputs A0, E0_and (E1.XM2)_, and again E0 , E1 and XM2 signals must be active (high) for the data, A0, to be driven by device 4A.

For driver operation at 2.5 V output levels in the high impedance mode, additional pull-up pre-drive is provided by NAND gate 5 with inputs A0, E0 and E1.VM2. Thus, in addition to E0 and E1, signal VM2 must also be active (high) for the data, A0, to be driven by device 6. Similarly, in low impedance mode, additional pull-up pre-drive is provided by NAND gate 5A with inputs A0, E0 and E1.VM2.XM2. Thus E0, E1, VM2 and XM2 signals must all be active (high) for the data, A0, to be driven by device 6A.

For driver operation at 1.8 V output levels in the high impedance mode, additional pull-up pre-drive is provided by nor gate 7 with inputs A0, E0_and (E1.VM1)_. Thus, in addition to E0 and E1, signal VM1 must also be active (high) for the data, A0, to be driven by device 8. Similarly, in low impedance mode, additional pull-up pre-drive is provided by NAND gate 7A with inputs A0, E0 and (E1.VM1.XM2)_. Thus E0, E1, VM1 and XM2 signals must all be active (high) for the data, A0, to be driven by device 8A.

Note that, in all cases described above, there is an inversion in the pre-drive stage, and a further inversion in the output stage, such that the driver is a non-inverting design.

Throughout this paper we refer to the results of of numerical simulation of the circuits described. The simulations were done with models based on a 0.35 micron effective gate length (Leff) CMOS technology, and a nominal voltage of 3.3 V. Because circuit delays, impedance, current, etc are functions of CMOS dimensions, circuit temperature, and operating voltage, these parameters were varied. For what follows we refer to nominal, worse case fast, and worse case slow conditions. Nominal conditions are: nominal CMOS feature size, temperature 50° C., nominal voltage. Worse case fast conditions are: CMOS feature size 3 standard deviations smaller than nominal, temperature 90° C., voltage+5% above nominal. Worse case slow conditions are: CMOS feature size 3 standard deviations larger than nominal, temperature 10° C., voltage −5% above nominal.

Figure 7:
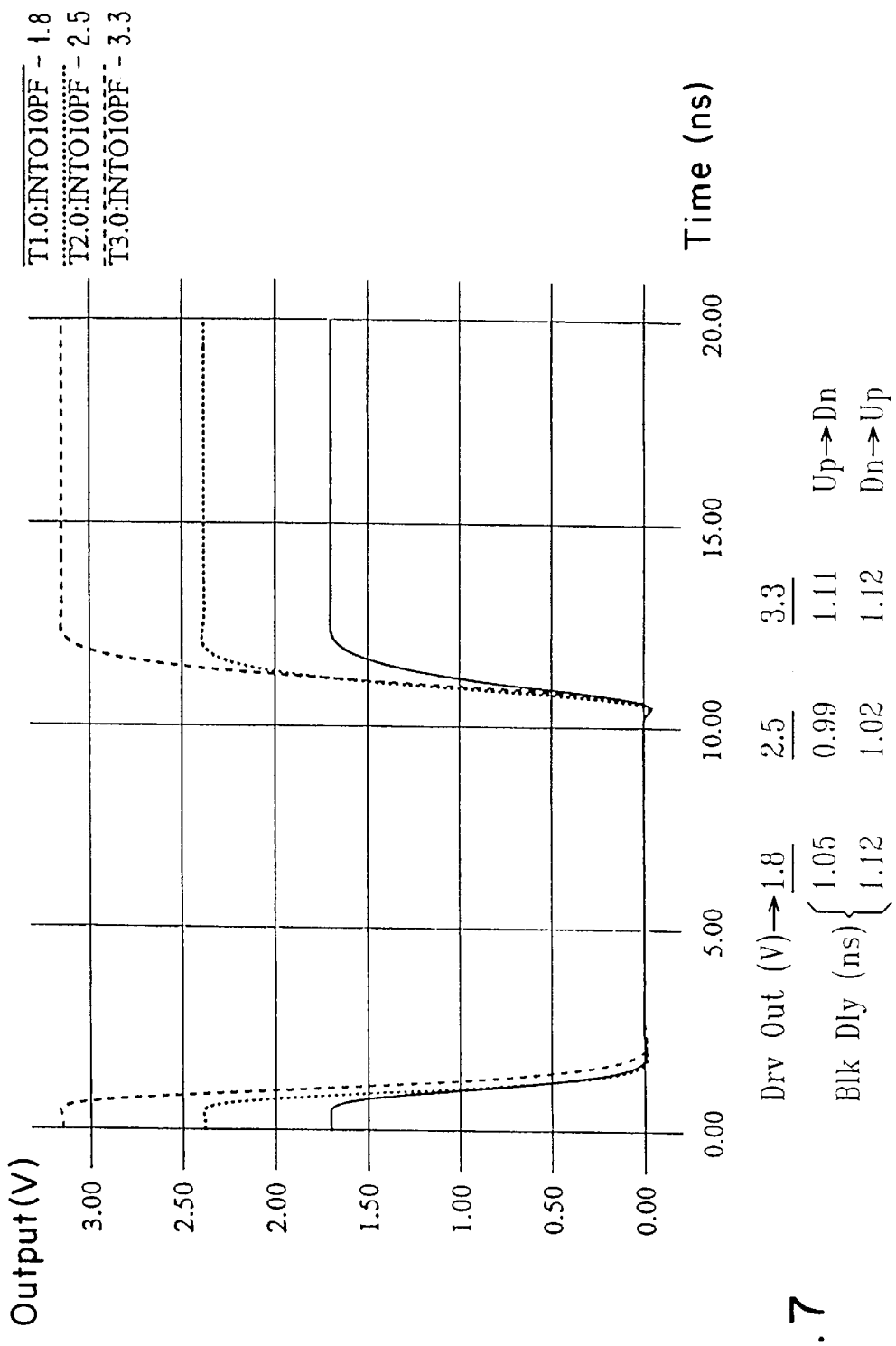
FIG. 7 shows a simulated voltage waveform of the driver of FIG. 3 charging and discharging a 10 pF capacitor at 100 MHz at the output of a chip for three different voltages, under worse case slow conditions. The time to drive from a low state to a high, or reverse, is essentially independent of the voltage.

FIG. 7 shows simulated voltage waveforms at the driver output, operating in low impedance mode (25 ohm), into a 10 pF test load for the three output voltage ranges. The simulations were done with models based on a 0.35 micron effective gate length (Leff) CMOS technology under worst case slow conditions to determine the maximum block delays as shown in FIG. 7.

Figure 8:
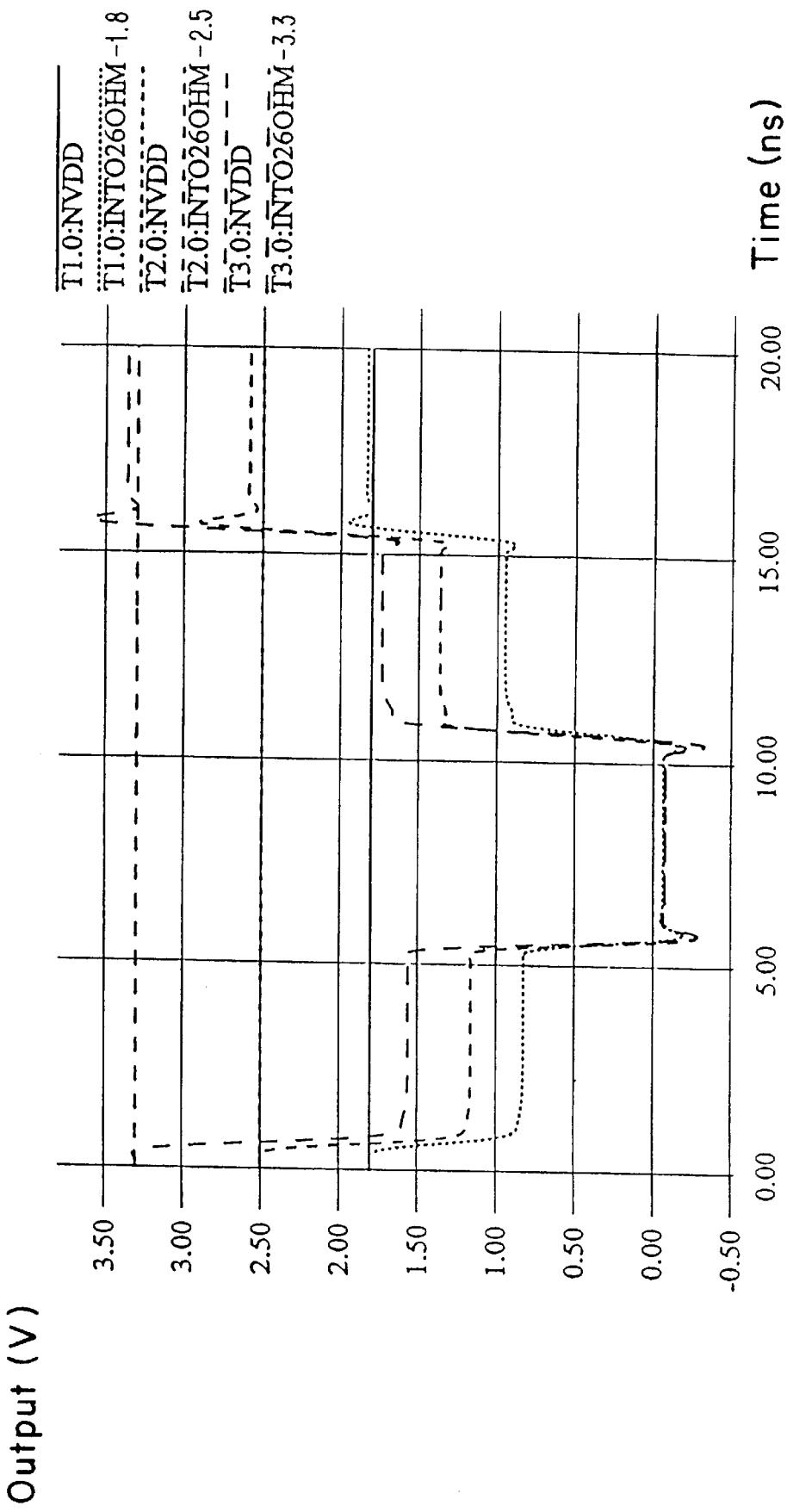
FIG. 8 shows a simulated voltage waveform of the driver of FIG. 3 charging and discharging a 25 ohm transmission line at 100 MHz, for three different voltages, under nominal conditions. The driver impedance is constant and equal to 25 ohms.

FIG. 8 shows simulated voltage waveforms at the driver output, operating in low impedance mode (25 ohm), into a 26 ohm transmission line for nominal conditions using the same CMOS technology as described above. These waveforms show that under nominal conditions, the driver output impedance is approximately 25 ohms at all output voltage levels.

Figure 9:
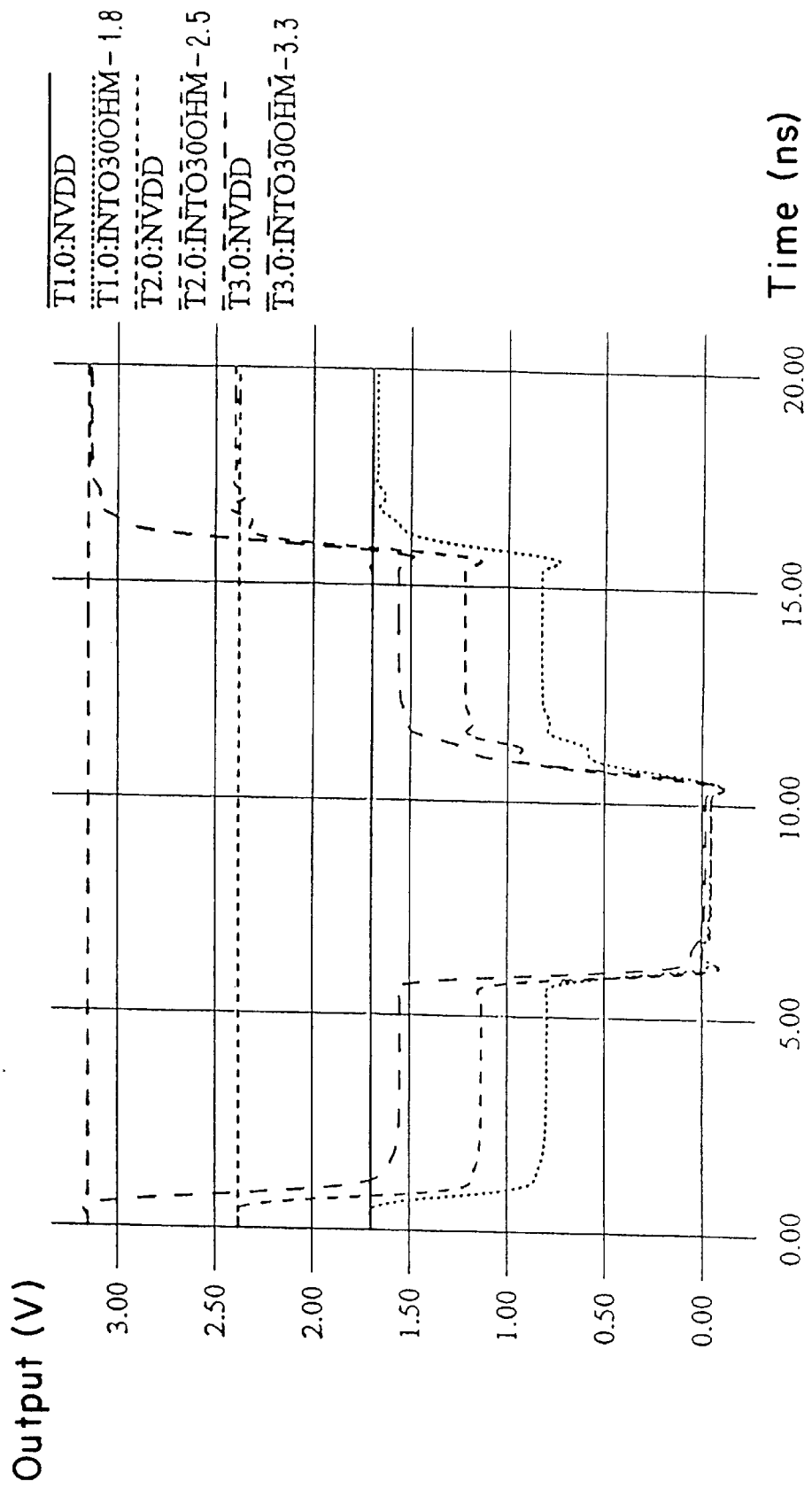
FIG. 9 shows a simulated voltage waveform of the driver of FIG. 3 charging and discharging a 30 ohm transmission line at 100 MHz, for three different voltages, under worse case slow conditions. The driver impedance is constant and equal to 30 ohms.

FIG. 9 shows simulated voltage waveforms at the driver output, operating in low impedance mode (25 ohm), into a 30 ohm transmission line for the same worst case slow conditions as described above for FIG. 7. These waveforms show that under worst case slow conditions, the driver output impedance has risen from its nominal value of 25 ohms to about 30 ohms at all output voltage levels.

Figure 10:
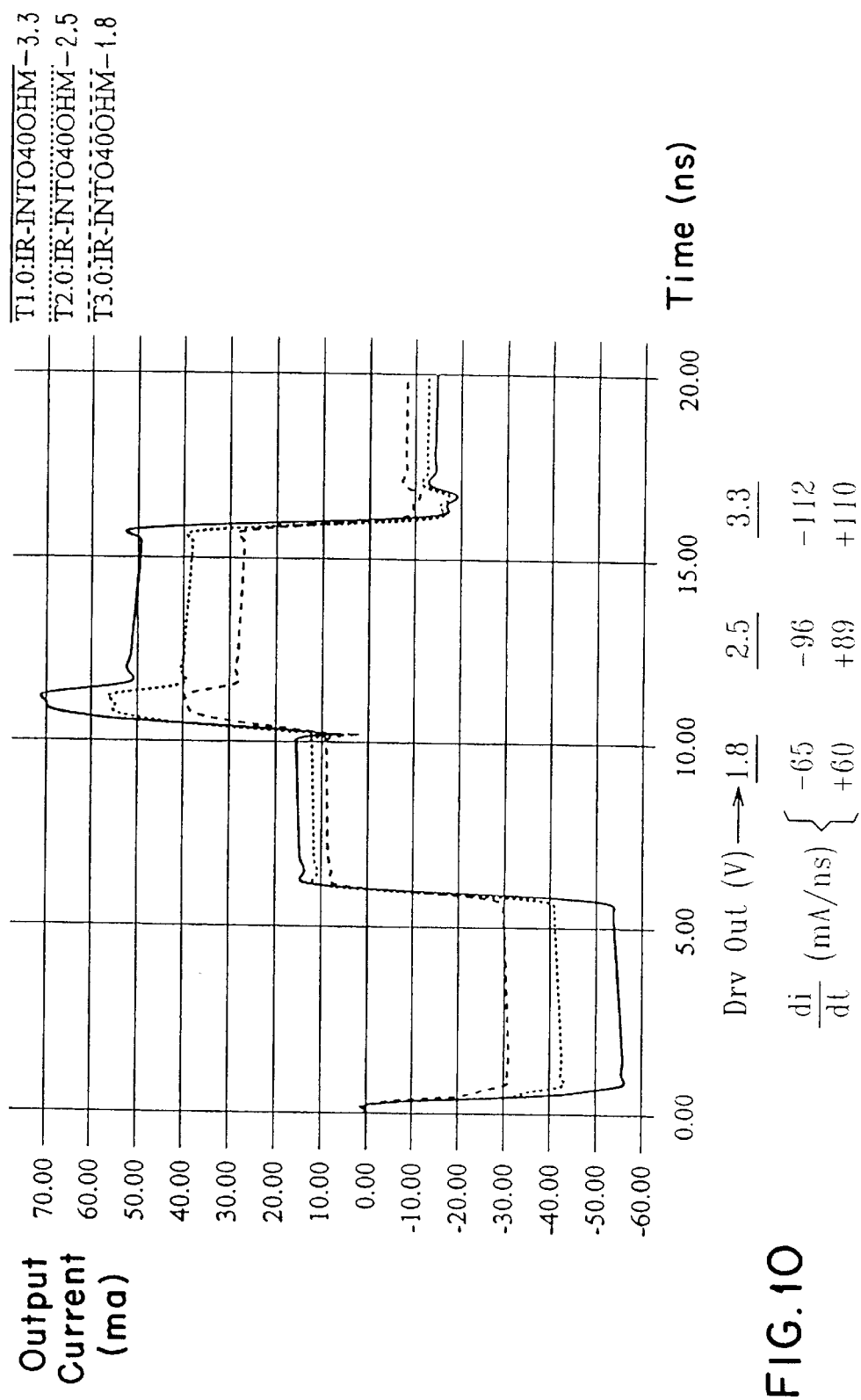
FIG. 10 shows a simulated current waveform of the driver of FIG. 3 charging and discharging a 40 ohm transmission line at 100 MHz, for three different voltages, under worse case fast conditions. The maximum change in driver current scales roughly with voltage and is approximately independent of transitions up or down.

FIG. 10 shows simulated current waveforms from the driver output into a 40 ohm transmission line under estimated worst case fast conditions using the same CMOS technology as described above. Also tabulated in FIG. 10 are di/dt values for each voltage level showing an approximately linear decrease of current with output voltage which is desirable for high simultaneous switching capability.

Figure 11:
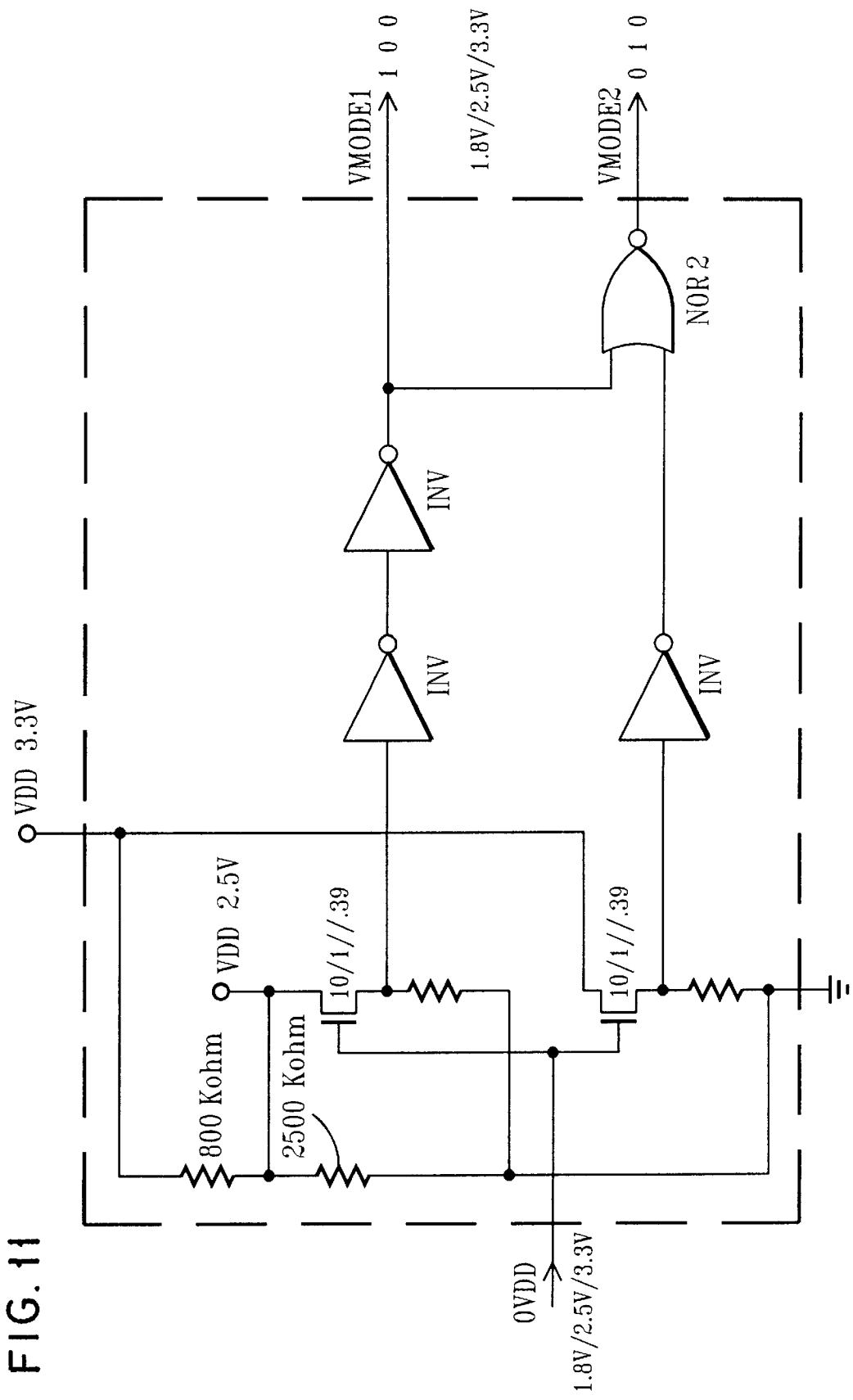
FIG. 11 shows a simple circuit that can be used to internally generate signals for 1.8 V, 2.5 V, or 3.3 V operation from sampling both the internal 3.3 V power rail and the external OVDD power rail that can either be 3.3 V, 2.5 V, or 1.8 V. These signals correspond to signals VM1 and VM2 of FIG. 1.

FIG. 11 shows a circuit which generates the control signals for the driver level select, VM1 and VM2 directly from the chip power supply voltage connections, VDD and OVDD. This circuit avoids the need for additional chip I/O pins to bring these level select control signals onto the chip. When OVDD is 3.3 V, both pFET devices, Q15 and Q16, are off, and the inputs to inverters I0 and I1 are both pulled low. Thus both VMODE1 and VMODE2 signals are held low. An OVDD of 2.5 V when applied to the gate of Q16 is low enough to turn this device on which pulls up the input of inverter I1. However, since the source voltage of pFET device Q15 is at 2.5 V, this device remains off leaving the input of inverter I0 low. Thus VMODE1 is held low, and VMODE2 is held high. When OVDD of 1.8 V is applied to the gates of Q5 and Q16, both devices are turned on pulling the inputs of both inverters I0 and I1 high. Thus both VMODE1 is held high and VMODE2 is held low. These signals, VMODE1 and VMODE2, can then be applied directly as controls to the VM1 and VM 2 inputs which are used in the driver described above. The logic is equivalent to the following table.

| Mode | VMODE1 | VMODE2 |
|------|--------|--------|
| 1.8V | 1 | 0 |
| 2.5V | 0 | 1 |
| 3.3V | 0 | 0 |
| N/A | 1 | 1 |

FIG. 12 shows detailed schematic of a CMOS receiver that can receive either 1.8 V, 2.5 V, or 3.3 V CMOS levels. It is a 4 stage non-inverting receiver, with all 4 inverters stages connected between ground and the internal voltage rail VDD of the CMOS chip. The last or 4th stage of the receiver is a large CMOS inverter, 1295. The pullup pFET device is formed of 8 parallel 10 micron wide, 0.39 micron long pFETs, each with its source connected to VDD, and its drain to the receiver output 1299, shown driving a 1 pF capacitor 1298. The pulldown device of the 4th stage inverter is formed from 8 parallel 5 micron wide, 0.36 micron long nFETs, with source connected to ground and drain connected to the receiver output 1299.

The input to the receiver, 1210, drives the gate of the 1st stage inverter, 1215. This inverter stage has a variable threshold. The threshold is varied as follows. Referring to the control block 1260 of FIG. 12 there are two control lines, VMODE1 (1201) and VMODE2 (1202), corresponding to control lines VM1 (104) and VM2 (105) of FIG. 1, that are used to change the 1st stage inverter 1215 threshold according to truth table 1205. When control line VMODE1 is low (0 Volts) and control line VMODE2 is high (3.3 Volts), the driver of FIG. 3 is in 2.5 V volt mode, as explained earlier. In this case the inverter 1215 should switch states at roughly 1.25 V, or OVDD/2, under nominal conditions. This is accomplished by turning both pFET 1250 and nFET 1240 on, so that the inverter 1215 contains both the 2.6 micron wide, 0.39 micron long pFET 1212 and the pFET stack 1230 and 1250, effectively 3.6 micron wide and 0.39 micron long, in parallel. The result is an effect pFET pullup device of 6.2 micron width and 0.39 micron length. Similarly nFET 1214 is in parallel with nFET stack 1240 and 1220, and the effective size of the nFET pulldown device is 7.2 micron wide and 0.36 micron long. The 1st stage inverter 1215, thus configured, has a switch point of 1.26 V under nominal conditions. The threshold drops to 1.19 V under worse case fast conditions on process, temperature, and voltage, which is acceptable. The threshold is unchanged under worse case fast conditions.

When control line VMODE1 is high and control line VMODE2 is low, the driver of FIG. 3 is in 1.8 V volt mode. In this case the inverter 1215 should switch states at roughly 1.0 V, or just over OVDD/2, under nominal conditions. We put the threshold just over VDD/2 to get increased immunity from ground bounce at low signal swings. This is accomplished by turning pFET 1250 off, but leaving nFET 1240 on, so that the inverter 1215 contains for a pullup device just the pFET 1212. As explained above nFET 1214 is in parallel with nFET stack 1240 and 1220, and the effective size of the nFET pulldown device of inverter 1215 remains 7.2 micron wide and 0.36 micron long. The 1st stage inverter 1215, thus configured, has a switch point of 1.0 V under nominal conditions. The threshold drops to 0.87 V under worse case fast conditions on process, temperature, and voltage, which is acceptable. The threshold rises to 1.03 V under worse case slow conditions on process, temperature, and voltage, which is acceptable.

When control line VMODE1 is low and control line VMODE2 is low, the driver of FIG. 3 is in 3.3 V volt mode. In this case the inverter 1215 should switch states at roughly 1.4 V, or just under OVDD/2, to comply with standard practice in receiving 3.3 V CMOS signals. This is accomplished by turning pFET 1250 on, and turning nFET 1240 off, so that the inverter 1215 contains for a pullup device the three pFETs 1212, 1230, and 1250, but the pulldown device is just the nFET 1214. The 1st stage inverter 1215, thus configured, has a switch point of 1.46 V under nominal conditions, and is stable to within 20 mV for both slow and fast conditions, which is acceptable.

Inverter 1270, the second stage of the receiver, is somewhat larger than inverter 1215, and is used to reduce the circuit delay of the receiver and to center the threshold at roughly 1.5 V. It has an 8 micron wide, 0.39 micron long pFET pullup and a 4 micron wide, 0.36 micron long nFET pulldown. The gates of these devices are connected to the output of inverter 1015, and the ouput of the inverter 1270 in turn drives the next or 3rd stage of the receiver.

The 3rd stage of the receiver of FIG. 12 is configured as a 2 input mux, to allow for data to come either from input 1280, or test data input 1282, under control of control signal line 1284 and its complement, 1286. When the control signal line 1284 (labeled bndy_is_sel in FIG. 12) is 0, then test data from 1282 is passed to output 1286 and then to the final stage 1295 of the receiver. When the control signal line 1284 (labeled bndy_is_sel in FIG. 12) is 1, then data from 1280 is passed to output 1286 and then to the final stage 1295 of the receiver.

FIG. 13 is another example of a 4 stage receiver, but with a somewhat improved structure for the scan mux unit 1290 of FIG. 12. All labels 13xx of FIG. 13 correspond to labels 12xx of FIG. 12. The improved unit 1390 has a symmetric structure, so that the delay through the mux is shortest for data from 1380, and is independent of the value of the test data on line 1382. The devices that pass that test data are also reduced in size, as this is not a speed critical path. This saves chip area and also slightly reduces the delay of the data path. The controlled devices for the data path, 1387 and 1388, are located next to the power rails to improve switch time. The controlled devices on the test data path, 1381 and 1382, are located at the output of the mux inverter 1390 to reduce loading on the data path. This is in contrast with the usual mux structure 1290, where the delay through the mux for data from point 1280 depends somewhat on the value of the test data 1282, and the devices for the test data path and data path are the same size. FIG. 13 is our preferred structure but FIG. 12 is certainly adequate.

Table 1 contains a summary of all information discussed above for the receiver of FIG. 12, including delay, standby current, and threshold for slow, fast, and nominal conditions. Note that the delay through the receiver is almost independent of the risetime of the input pulse, as the risetime is varied from 1 nanosecond to 6 nanoseconds. This is a very desirable property of a receiver.

The receiver leakage current, or current that runs from VDD to ground through the after a long period of inactivity at the input, is negligible in 3.3 V mode, grows to roughly 60 microamps for 2.5 V mode, and is as large as 250 microamps under fast conditions in 1.8 v mode. This is seen in the column under I (mA) in Table 1. The reason for this leakage at 1.8 V is that the pullup device 1212 is not fully turned off by a positive input (1210 is at 1.8 V) to the receiver. This problem can be corrected by the use of extra pullup devices on the input to shut off current through the device 1212, but also results in increased delay through the receiver. Alternatively the first stage of stages of the receiver can be connected to OVDD rather than VDD, but this also results in increased delay for 1.8 V mode. Our choice is a compromise between power and delay.

Figure 14:
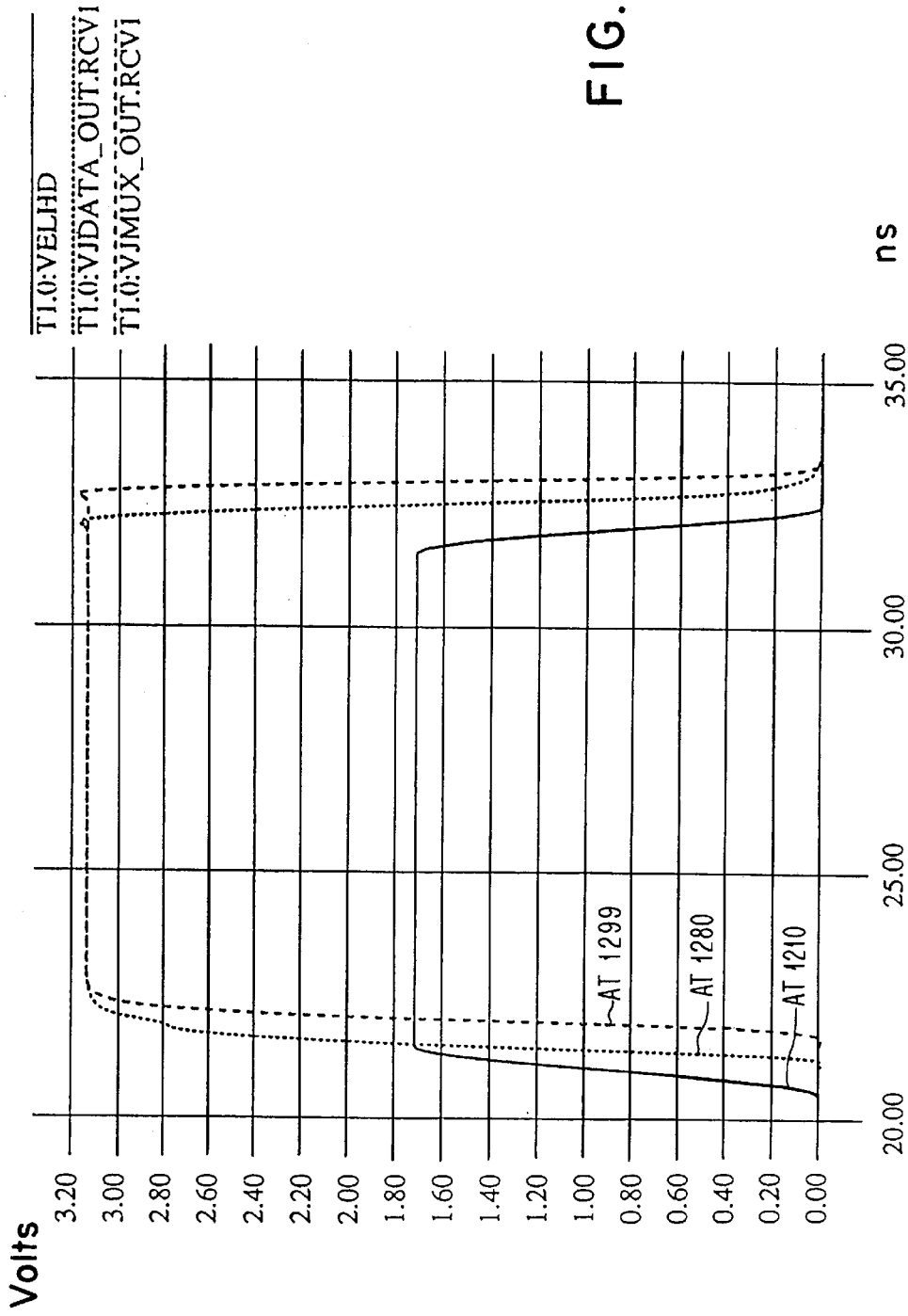
FIG. 14 shows a simulated waveform at various points within the receiver, for 1.8 V input threshold and worse case slow conditions.

FIG. 14 shows simulated waveforms for a 100 MHz signal into the receiver of FIG. 12, with the threshold appropriate for 1.8 V OVDD. The 3 waveforms shown correspond to sampling at locations 1210, 1280, and 1299 of FIG. 12, under worse case slow conditions.

Figure 15:
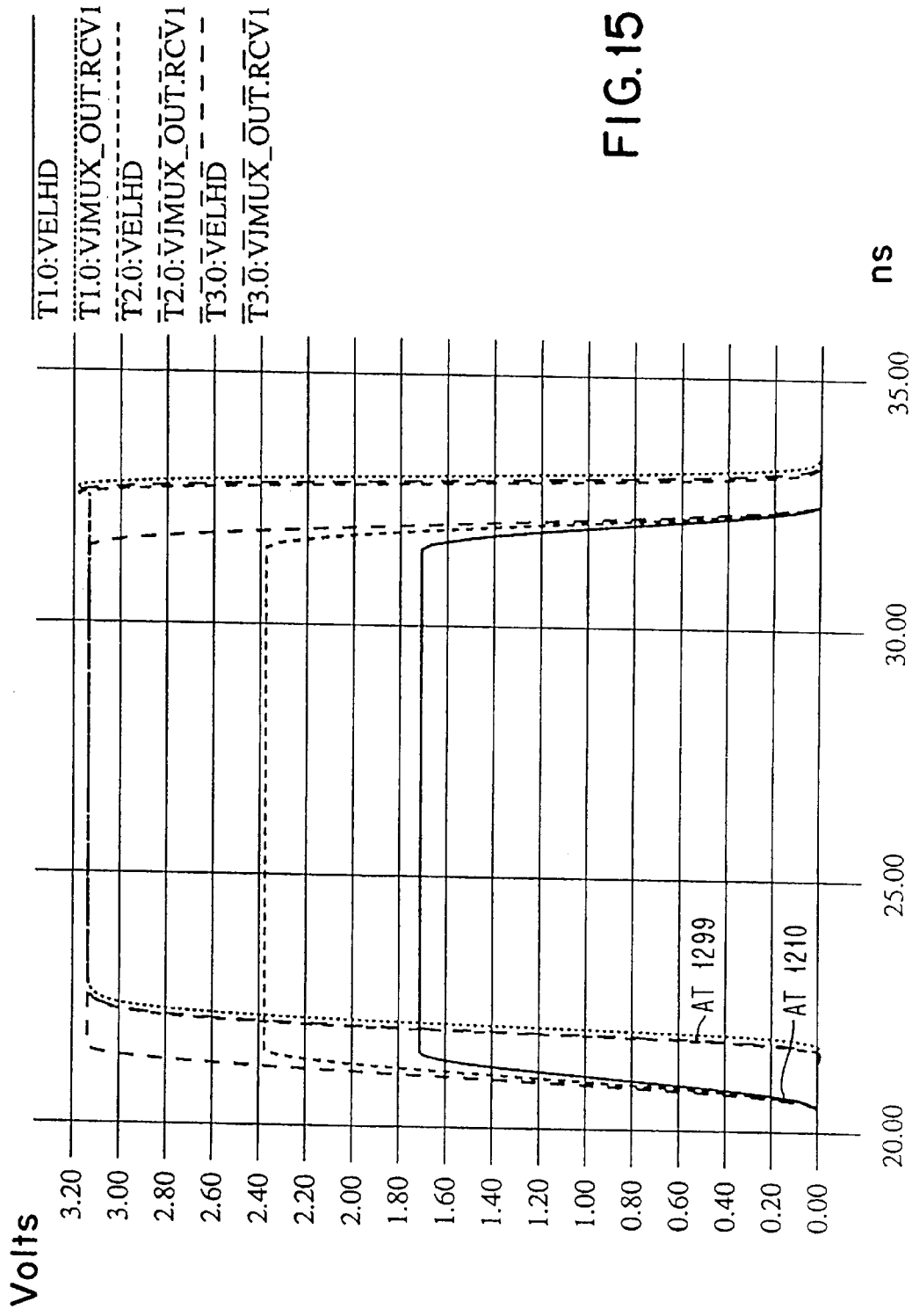
FIG. 15 shows a simulated waveform at the input and output of the receiver, for 3 different received voltages, under worse case slow conditions. The receiver delay is essentially independent of received voltage.

FIG. 15 shows simulated waveforms for a 100 MHz signal into the receiver of FIG. 12, at 3 different input voltage waveforms, under worse case slow conditions. Waveforms are shown for signals at location 1210 (input) and 1299 (output). The delay through the receiver is nearly independent of voltage, and is approximately the same for transitions from high to low or low to high. This figure, and other like it for nominal and worse case fast conditions, are used to compute the data in Table 1.

In summary we present a method for communication between chips of different internal voltages. The method has the advantages of defaulting to common practice, i.e., communication at the internal voltage of the chip, when all chips have the same voltage. The method has the advantage of migrating the communication voltage to the voltage of the chip with the lowest internal voltage of all chips on a common bus, so that the chip with the lowest internal voltage, which is usually the fastest, costliest, and most sensitive chip, has just a single voltage for both internal and external operation. The method has the advantage of never requiring a chip to send or receive a voltage to another chip which is higher than its internal voltage. The method has the advantage that migration to an external voltage which is lower than the chip's internal voltage does not cause significant increased delay, or a significant change in driver impedance. The method has the advantage that the chip area required for this generality is only a small increase over that required for operation at the same internal and external voltage. The method has the advantage that the driver impedance can be changed to suit the driven load, under automatic control. The method has the advantage that migration to a different voltage can be sensed internal to the chip, or can be programmed to the chip through external control lines.

While the invention has been shown and described with respect to particular embodiments thereof, it will be understood by those skilled in the art that changes in form and detail may be made without departing from the spirit and scope of the invention. In particular these structures hold for any voltage CMOS electronic device, including but not restricted to processors, controllers, and memory devices.

TABLE 1

Summary of Simulation Results of RCV_C18, RCV_C25, and RCV_C33 Receivers

| Net Name | N/F/S | DATA_OUT to DATA_OUT (nS) | DATA_OUT to MUX_OUT (nS) | Total (nS) | I (mA) | Comment |
|---|---|---|---|---|---|---|
| Vin 1.8V | | | | | | |
| RCV_C18n | N | 0.29/0.41 | 0.37/0.31 | 0.65/0.72 | 130E-3 | 1nS Trise |
| RCV_C18f | F | 0.19/0.27 | 0.23/0.19 | 0.42/0.46 | 250E-3 | 1nS Trise |
| RCV_C18s | S | 0.42/0.59 | 0.55/0.46 | 0.97/1.05 | 77E-3 | 1nS Trise |
| RCV_C186n | N | 0.38/0.67 | 0.37/0.31 | 0.75/0.98 | 130E-3 | 6nS Trise |
| RCV_C186f | F | 0.25/0.47 | 0.24/0.20 | 0.49/0.67 | 250E-3 | 6nS Trise |
| RCV_C186s | S | 0.59/0.87 | 0.55/0.46 | 1.14/1.33 | 77E-3 | 6nS Trise |
| Vin 2.5V | | | | | | |
| RCV_C25n | N | 0.23/0.29 | 0.37/0.31 | 0.60/0.60 | 23E-3 | 1nS Trise |
| RCV_C25f | F | 0.14/0.20 | 0.23/0.20 | 0.37/0.40 | 62E-3 | 1nS Trise |
| RCV_C25s | S | 0.34/0.40 | 0.55/0.46 | 0.88/0.86 | 11E-3 | 1nS Trise |
| RCV_C256n | N | 0.28/0.50 | 0.37/0.31 | 0.65/0.81 | 23E-3 | 6nS Trise |
| RCV_C256f | F | 0.17/0.38 | 0.24/0.19 | 0.41/0.57 | 62E-3 | 6nS Trise |
| RCV_C256s | S | 0.44/0.64 | 0.55/0.46 | 0.99/1.10 | 11E-3 | 6nS Trise |
| Vin 3.3V | | | | | | |
| RCV_C33n | N | 0.29/0.28 | 0.37/0.31 | 0.66/0.59 | 0 | 1nS Trise |
| RCV_C33f | F | 0.20/9.19 | 0.23/0.20 | 0.43/0.39 | 0 | 1nS Trise |
| RCV_C33s | S | 0.40/0.41 | 0.55/0.46 | 0.95/0.86 | 0 | 1nS Trise |
| RCV_C336n | N | 0.50/0.38 | 0.38/0.31 | 0.87/0.69 | 0 | 6nS Trise |
| RCV_C336f | F | 0.39/0.22 | 0.24/0.20 | 0.63/0.42 | 0 | 6nS Trise |
| RCV_C336s | S | 0.64/0.55 | 0.56/0.46 | 1.20/1.01 | 0 | 6nS Trise |

1st number in each delay column is for L/H transition. 2nd number in for H/L transition, N, F, S are nominal (50 C, nrn 0.50, speed 0), fast (10 C, nrn 0.04, speed −1), slow (90 C, nrn 0.91, speed 1) conditions, respectively.
VDDQ (Vin) 1.8V/2.5V/3.3V; VDD 3.3V.
V (threshold) used for measurement are:
1.00V/0.87V/1.03V (N/F/S) for 1.8V;
1.26V/1.19V/1.26V (N/F/S) for 1.25V;
1.46V/1.46V/1.44V (N/F/S) for 3.3V

We claim:

1. A structure comprising:
    a plurality of electronic devices with the same or different internal voltages;
    an interconnection between two or more of said plurality of electronic devices;
    each of said two or more electronic devices has an internal voltage;

driver and receiver circuits which send and receive signals at a selectable communication voltage levels for interfacing between said two or more electronic devices, at a common communication voltage which is less than the highest value of said internal voltages of said two or more electronic devices;

means for configuring said driver and receiver circuits;

said driver circuit being configured to have a substantially constant output impedance independent of their output voltage.

2. A structure according to claim 1 wherein each of said electronic devices is a CMOS device.

3. A structure comprising:

a substrate;

a control device electronically connected to said substrate;

one or more locations for receiving a controlled device;

said one or more locations providing means for electronically connecting said control device to said controlled device; and said control device has a self adjusting impedance, adjusting in response to the number of controlled devices placed at said one or more locations.

4. A structure according to claim 3 wherein each of said electronic devices is a CMOS device.

5. A structure comprising:

a plurality of electronic devices with the same or different internal voltages;

an interconnection between said plurality of electronic devices;

driver and receiver circuits which send and receive signals at a selectable communication voltage levels for interfacing between said plurality of electronic devices, at a common communication voltage which is less than or equal to the highest value of said internal voltages;

means for configuring said driver and receiver circuits;

circuitry for selecting or adjusting the output impedance of said driver circuit so that a desired substantially constant output impedance level is achieved for said selectable communication voltage levels.

6. A structure according to claim 5 wherein each of said electronic devices is a CMOS device.

7. A structure comprising:

a plurality of electronic devices with the same or different internal voltages;

an interconnection between said plurality of said electronic devices;

driver and receiver circuits coupled to said at least two of said plurality of electronic devices which provide selectable input/output voltage levels for interfacing with said at least two of said plurality of electronic devices, thus allowing said at least two electronic devices to communicate using a value of said selectably input/output voltage which is less than or equal to the highest of said internal voltages of said at least two electronic devices;

circuitry for selecting or adjusting the output impedance of said driver circuit so that a desired output impedance level is achieved for each of said selectable input/output voltage levels;

circuitry for providing multiple output impedance levels for said driver circuit, such that said multiple impedance levels are achieved for each of said selectable input/output voltage levels.

8. A structure according to claim 7 wherein each of said electronic devices is a CMOS device.

9. A structure comprising:

a plurality of electronic devices with the same or different internal voltages;

an interconnection between at least two of said electronic devices;

driver and receiver circuits coupled to said at least two electronic devices which provide selectable input/output voltage levels for interfacing with said at least two electronic devices, thus allowing said at least two electronic devices to communicate using a value of said selectably input/output voltage which is less than or equal to the highest of said internal voltages of said at least two electronic devices;

means for automatically configuring said drivers and receivers;

said driver being configured to have a substantially constant output impedance of their output voltages.

10. A structure according to claim 9 wherein each of said electronic devices is a CMOS device.

11. A structure comprising:

a plurality of electronic devices with the same or different internal voltages;

an interconnection between at least two of said plurality of electronic devices;

driver and receiver circuits coupled to said at least two electronic devices which provide selectable input/output voltage levels for interfacing with said at least two electronic devices, thus allowing said at least two electronic devices to communicate using a value of said selectably input/output voltage which is the lowest of said internal voltages of said at least two electronic devices;

circuitry for selecting or adjusting a switching threshold of said receiver circuit, which enables said threshold to be set for said input voltage said driver circuit has a substantially constant output impedance.

12. A structure according to claim 11 wherein each of said electronic devices is a CMOS device.

13. A structure comprising:

a plurality of electronic devices with the same or different internal voltages;

an interconnection between at least two of said electronic devices;

driver and receiver circuits which provide selectable input/output voltage levels for interfacing with said at least two electronic devices, thus allowing said at least two electronic devices to communicate using a value of said selectably input/output voltage which is less than or equal to the highest of said internal voltages of said at least two electronic devices;

circuitry for selecting or adjusting a switching threshold of said receiver circuit, which enables said threshold to be set for said input voltage;

circuitry for the inclusion of an alternate data path in said receiver circuit, to allow for test data to be passed through said receiver in place of externally received data.

14. A structure according to claim 13 wherein each of said electronic devices is a CMOS device.

* * * * *